United States Patent [19]
Reich et al.

[11] Patent Number: 5,281,955
[45] Date of Patent: Jan. 25, 1994

[54] BATTERY CHARGE MONITORING APPARATUS AND METHOD

[75] Inventors: Gregory N. Reich, Schwenksville; Randall Hertzler, Lancaster, both of Pa.

[73] Assignee: C & D Charter Power Systems, Inc., Plymouth Meeting, Pa.

[21] Appl. No.: 762,753

[22] Filed: Sep. 20, 1991

[51] Int. Cl.$^5$ .............................. G08B 21/00
[52] U.S. Cl. ........................ 340/636; 320/48; 323/371; 324/435; 364/551.01
[58] Field of Search ............ 340/636, 517, 521; 324/435, 433, 429, 426; 320/48; 323/371; 364/551.01

[56] References Cited

U.S. PATENT DOCUMENTS

| | | | |
|---|---|---|---|
| 3,657,639 | 4/1972 | Willihnganz | 324/433 |
| 3,812,415 | 5/1974 | Van Gilder et al. | 320/31 |
| 3,914,685 | 10/1975 | Van Gilder | 323/248 |
| 3,921,197 | 11/1975 | Horvath | 363/17 |
| 4,423,379 | 12/1983 | Jacobs et al. | 340/636 |
| 4,460,954 | 7/1984 | Aiken et al. | 363/75 |
| 4,584,514 | 4/1986 | Kaminski | 320/33 |
| 4,779,050 | 10/1988 | Ohnari | 320/48 |
| 4,843,372 | 6/1989 | Savino | 340/540 |
| 4,929,931 | 5/1990 | McCuen | 320/48 |
| 5,027,294 | 6/1991 | Fakruddin et al. | 340/636 |
| 5,119,011 | 6/1992 | Lambert | 340/636 |
| 5,130,699 | 7/1992 | Reher et al. | 340/636 |

Primary Examiner—Glen R. Swann, III
Attorney, Agent, or Firm—Dann, Dorfman, Herrell and Skillman

[57] ABSTRACT

An apparatus and method for monitoring operation and recording status of at least one battery component of an uninterruptable power supply is provided. Physical parameters of a battery are sensed and stored upon deviation from preselected limits. In addition, the present value of the physical parameters are displayed. Back-up power is supplied upon the interruption of utility power. Furthermore, an operator is signaled with an alarm when utility power is interrupted or there is deviation from preselected battery operation limits.

28 Claims, 21 Drawing Sheets

For remote accesses that are attended, use the command line:

C: >BCM -re -n5551212 -d -e<return>

Now the program dials the phone number of the remote BCM, and retrieves the event records. The records are saved in the file EVENTS.DAT.

Fig. 26

DIAGNOSTICS
   m(o)dem
   Pass (w)ord
     (T)ime & date
     (V)alues
     (S)tack
     (Q)uit CALIBRATION
   (1) 0 V
   (2) 0 I
   (3) 0 BB
   (4) Scale V
   (5) Scale I
   (6) Scale BB
   (7) Scale T
   (8) Set R
   (Q) uit STARTUP
   (I)nvoice #
   (R)ep #
   (C)ustomer #
   Ce(l)l type
   Cell q(u)antity
   (S)hunt
   (W)arranty type
   (Q)uit PROGRAM PARMS
   Nominal link (v)oltage
   (F)loat deviation
   Rated (c)urrent
   (D)ischarge deviation
   Rate (p)ower
   P(o)wer deviation
   Nominal (t)emperature
   T(e)mperature deviation
   (Q)uit

Fig. 27

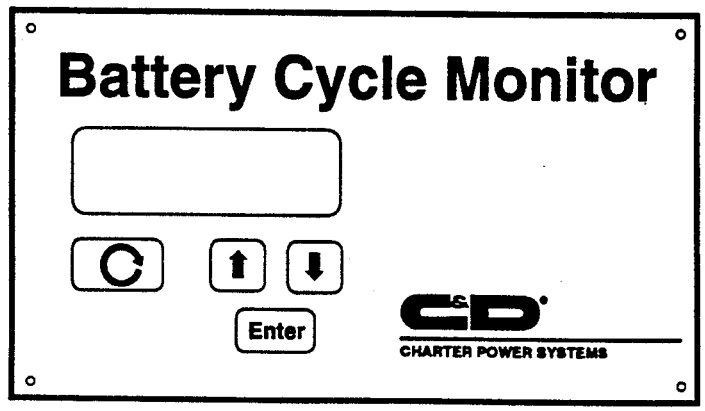

Fig. 19

```
SETUP SUMMARY:  (Invoice #05-039281   03/28/90   15:38:45)
STARTUP PARAMETERS:  (@ 01/23/90   08:23.31)
Rep # =            59                    Customer # =      23917
Cell type =        XT2LC-25              Cell quantity =   250
Shunt # =          PK-3066               Warranty type =   1
PROGRAMMABLE PARAMETERS:
Nominal link voltage (V) = 562    Float deviation (V) =         17
Rated current (A) =        2460   Discharge deviation (A) =     10
Rated power (kW) =         984    Power deviation (kW) =        98
Nominal temperature (F) = 77      Temperature deviation (F) =   10

CALIBRATION:  (@ 01/04/90   15:30.03)
Rshunt (ohms) =              0.000009824
```

Fig. 23

```
For remote accesses that are attended, use the command line:

C: >BCM  -re  -n5551212  <return>

Now the program will not prompt for a phone number before a
remote access.
```

Fig. 24

```
BCM Communication Utility       LOCAL ACCESS via COM Port
V1.00 [03/90]                      (I)nteractive session
   (L)ocal COM port session        (R)eport retrieval
   (M)odem session                 (Q)uit
   (Q)uit to DOS
                                REMOTE ACCESS via MODEM
                                   (I)nteractive session
                                   (R)eport retrieval
                                   (Q)uit REPORT RETRIEVAL
                                   (E)vent records [binary]
                                   E(v)ent summary
                                   (S)etup summary
                                   (Q)uit
```

Fig. 25

BATTERY CHARGE MONITORING APPARATUS AND METHOD

BACKGROUND OF THE INVENTION/DESCRIPTION OF THE PRIOR ART

Summary of the Invention

In one of its aspects, this invention provides an apparatus for monitoring operation and status of an uninterruptible power supply system defined by one or more lead-acid batteries, where the apparatus includes means for visibly displaying alphanumeric characters indicative of battery operating parameters, means operative responsively to tactilely applied force for actuating and changing the battery parameters for which the display means provides the indicative alphanumeric characters, means for storing the measured and monitored operating parameters, battery means for supplying back-up power to the apparatus in the event of a power interruption and alarm means for signaling an operator upon one or more of the monitored parameters exceeding a predetermined limit.

In another of its aspects, this invention provides a method for monitoring operation and status of an uninterruptible power supply system defined by one or more lead-acid batteries, where the method includes visibly displaying alphanumeric characters indicative of battery operating parameters, displaying those characters responsively to tactilely applied force, changing those display parameters responsively to such tactilely applied force, measuring battery operating parameters indicative of battery performance, storing the measured operating parameters and signaling an operator when one or more of the measured parameters exceeds one or more predetermined limits.

Preferably the storing function is performed when the measured operating parameter(s) meets or exceeds predetermined criteria.

Preferably the method is performed by apparatus responsively to instructions executed by a microprocessor.

BRIEF DESCRIPTION OF THE DRAWINGS

FIG. 19 is a front view of the preferred embodiment of apparatus manifesting aspects of the invention.

FIGS. 20–27 are graphic renditions of menus displayed in the course of practicing the method of the invention where the menus appear either on an output screen portion of the apparatus illustrated in FIG. 19 or on a remote computer connected to the apparatus by a modem.

DESCRIPTION OF THE PREFERRED EMBODIMENTS AND BEST MODE KNOWN FOR PRACTICING THE INVENTION

Figure 1:
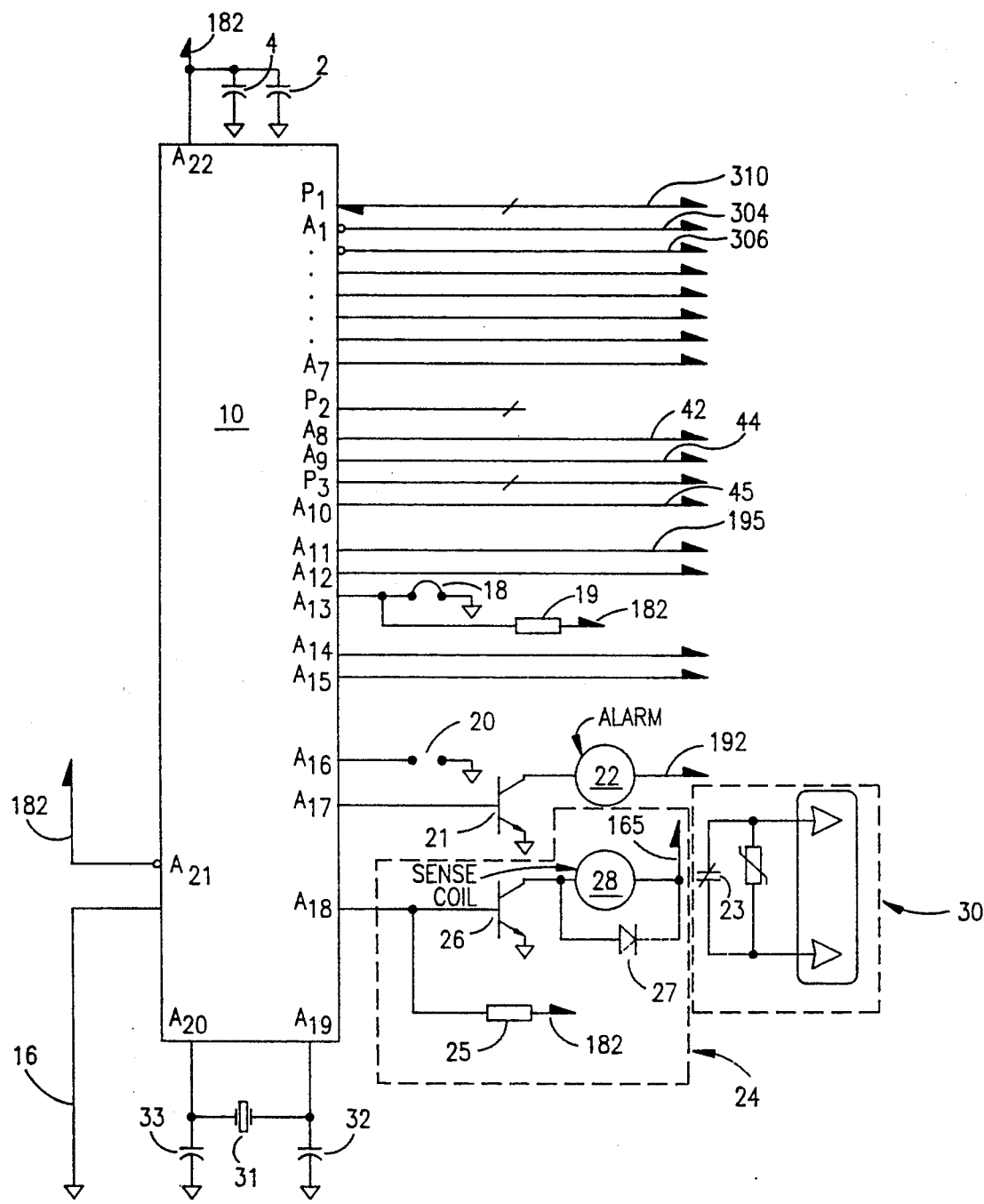
FIG. 1 is a schematic diagram of a portion of circuitry of the battery charge monitoring apparatus which, when fabricated, is preferably on a motherboard portion of the apparatus.

Referring generally to the drawings and specifically to FIG. 1, an 8051 64k non-volatile random access memory microprocessor designated generally 10 performs and controls the basic functions of the battery charge monitoring apparatus and receives as input power 5 volts provided at pin $A_{22}$ via an input line 182. Pin $A_{22}$ connects to a 10 microfarad capacitor designated 4 and a one-tenth (0.1) microfarad capacitor designated 2. Both capacitors 2 and 4 connect to ground. Microprocessor 10 also receives +5 volts at an enabling input pin $A_{21}$ via an input line 182. Microprocessor 10 is further connected to ground via a grounding line 16.

Output from microprocessor 10 is provided via ports $P_1$, and $P_3$ and output pins $A_1$ through $A_{18}$, as illustrated in FIG. 1. Port $P_1$ is an eight line output port while port $P_3$ is a two line output port.

Taken together, port $P_1$ and output pins $A_1$ through $A_7$ define modem, keypad and display interfaces for microprocessor 10. Pins $A_8$ and $A_9$ send data to pins $C_{16}$ and $C_{15}$ of a 10 to 13 bit dual slope analog-to-digital converter designated generally 40 along lines 42 and 44 as illustrated in FIG. 2b. Port $P_3$ provides input to pins $F_{14}$ and $F_{15}$ of an 8 to 1 analog multiplexer designated generally 72 in FIG. 3. Pin $A_{10}$ of microprocessor 10 receives data from pin $C_{14}$ of analog-to-digital convertor 40 via line 45 as illustrated in FIG. 1. Reset pin $A_{13}$ is also connected to one pin of a 2-pin connector. The other pin of the 2-pin connector is connected to ground. Jumper 18 connects the two pins of the 2-pin connector.

Figure 2A:
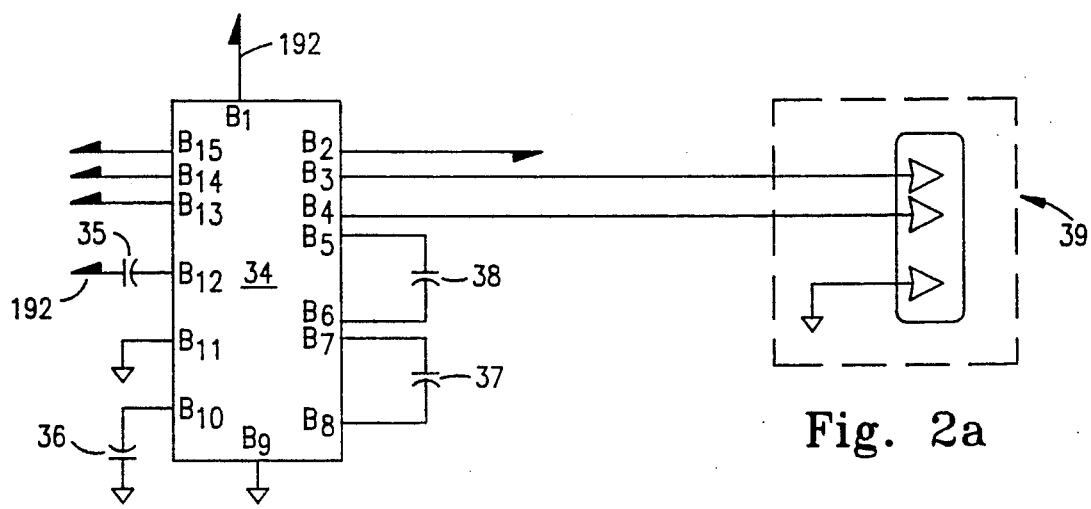
FIGS. 2a and 2b are schematic diagrams of portions of circuitry of the battery charge monitoring apparatus which, when fabricated, are preferably on a motherboard portion of the apparatus.
Figure 2B:
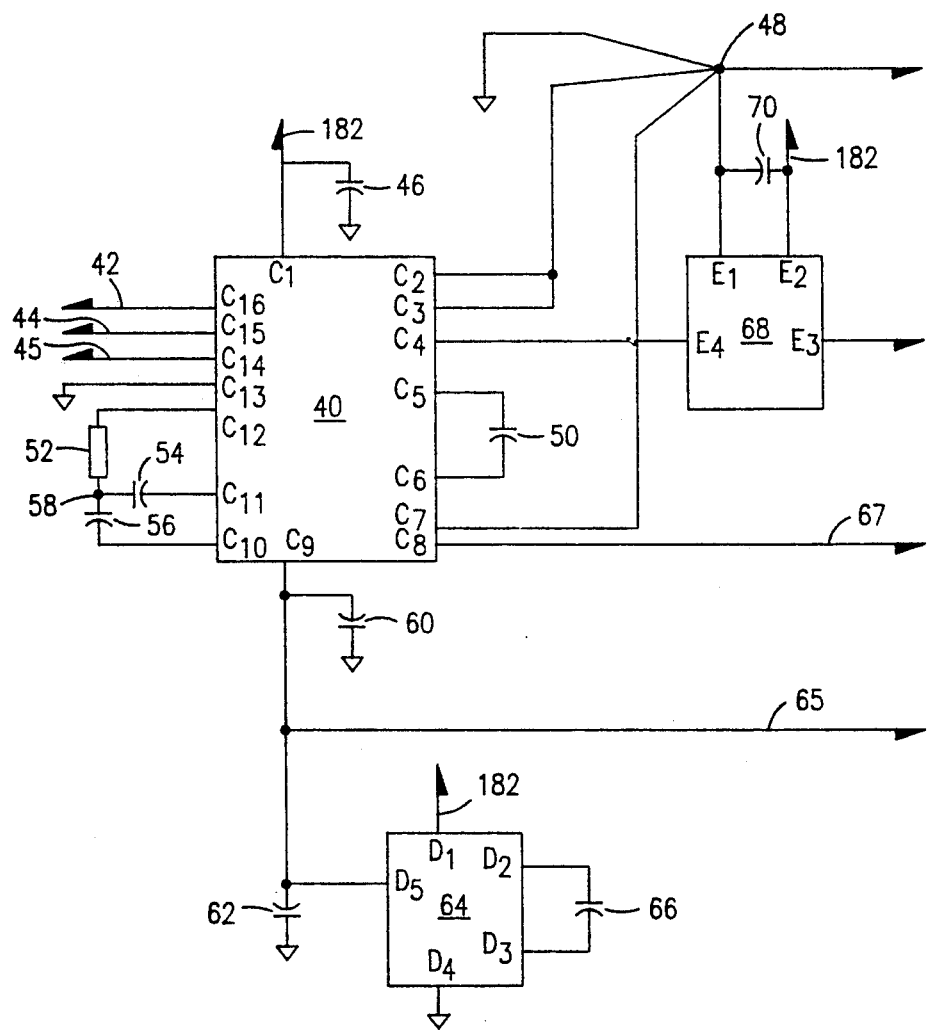

Pins $A_{14}$ and $A_{15}$ define a communications port and are connected to pins $B_{14}$ and $B_{13}$ of a +5 volt RS232C Tx/Rx chip designated generally 34 illustrated generally in FIG. 2. Chip 34 is connected to an appropriate terminal block shown schematically and designated generally as 39 in FIG. 2b. Terminal block 39 provides an interface with a serial printer or a computing device, which preferably supports RS232C communication at 9600 baud, 8 data bits, no parity and no busy protocol.

Pin $B_4$ of chip 34 receives information from the printer or computing device and outputs such information through $B_{13}$ to pin $A_{15}$ of microprocessor 10. Microprocessor 10 transmits data through pin $A_{14}$ to pin $B_{14}$ of chip 34 which in turn outputs the data through pin $B_3$ to terminal block 39 and a serial printer or computing device.

Chip 34 receives positive five volts via input line 192 through pin $B_1$ and connects to ground at pin $B_9$. A 22 microfarad capacitor 38 connects pin $B_5$ with pin $B_6$ as shown generally in FIG. 2. A second 22 microfarad capacitor 37 connects pin $B_7$ to pin $B_8$. Pin $B_{12}$ is connected to a 22 microfarad capacitor 35 which receives +5 volts via input line 192. Pin $B_{11}$ is grounded. Pin $B_{10}$ is connected to another 22 microfarad capacitor 36 which is also grounded.

Referring once again to FIG. 1, modem interrupt pin $A_4$ of microprocessor 10 connects to modem interrupt pin $B_{15}$ of chip 34. Pin $B_{15}$ links chip 34 to modem interrupt pin $S_{14}$ of a SIP-STIK, 1200 baud Hayes compatible modem socket designated generally 222 in FIG. 6. This circuitry permits an operator to interrupt any microprocessor activity and initiate an interactive session to access information stored by the battery cycle monitor from a remote location.

Referencing FIG. 1, pin $A_{16}$ of microprocessor 10 provides a connection to one pin of a 2-pin connector. The other pin of the 2-pin connector is connected to ground. As shown, the pins of the 2-pin connector are not connected, however, location 20 is provided for a jumper. Microprocessor 10 is connected via pin $A_{17}$ to the base of an NPN bipolar junction transistor 21 having its emitter connected to ground. The collector of transistor 21 is connected to a 5 volt piezo buzzer or audible alarm designated generally 22 and preferably mountable on a printed circuit board. Alarm 22 also preferably receives 5 volts supplied via line 192, all as illustrated in FIG. 1.

The circuitry designated generally as block 24 receives a signal from microprocessor 10 causing an external alarm contact designated generally 23 to open or to close. Alarm contact 23 is illustrated within dotted line block 30 which is intended to designate generally a suitable terminal block for connection to an external alarm.

Still referring to FIG. 1, the base of NPN bipolar junction transistor 26 connects to pin $A_{18}$ and 22k ohm resistor 25 which in turn connects to a positive five volts via line 182. The emitter of bipolar junction transistor 26 is connected to ground and the collector is connected to a one (1) amp 200 volt rectifying diode designated generally 27 which is in parallel with a DPDT 16DIP sense coil designated generally 28. Sense coil 28 and the cathode of diode 27 are connected to an unregulated A.C. voltage line 165.

Pin $A_{19}$ and $A_{20}$ of microprocessor 10, a 7.3278 Mhz crystal clock oscillator designated generally 31 and two 22 picofarad capacitors 32 and 33 define a clock. Pin $A_{19}$ connects to both capacitor 32 and oscillator 31. Pin $A_{20}$ connects to both capacitor 33 and oscillator 31. Capacitors 32 and 33 are also connected to ground.

Analog-to-digital converter 40 provides data to microprocessor 10 via output line 45. Lines 42, 44 and 45 are connect to pins $C_{16}$, $C_{15}$, and $C_{14}$ respectively of analog-to-digital converter 40. Pin $C_{13}$ connects to digital ground. Pin $C_1$ connects to positive five volts through line 182 and a one-tenth (0.1) microfarad capacitor 46 which in turn connects to ground. Analog ground pin $C_2$, negative voltage reference pin $C_3$ and negative voltage input pin $C_7$ are connected to a single node 48 which is connected to ground. Pin $C_5$ connects to capacitor reference pin $C_6$ through a one (1) microfarad capacitor 50. Positive voltage reference pin $C_4$ receives output from pin $E_4$ of a micropower 2.5 voltage temperature reference. Pin $C_{12}$ connects to node 58 through a 255k ohm resistor 52. Pin $C_{11}$ connects to node 58 through a one (1) microfarad capacitor 54. Pin $C_{10}$ connects to node 58 through a 0.082 microfarad capacitor 56.

A voltage invertor designated generally 64 converts positive 5 volts input at pin $D_1$ through line 182 and provides a negative 5 volts at pin $D_5$. Pin $C_9$ of the analog-to-digital converter 40 and pin $F_{10}$ of the 8 to 1 analog multiplexer 72 in FIG. 3 receive the negative 5 volts. Pin $D_4$ grounds voltage invertor 64. Pin $D_2$ is connected to pin $D_3$ by a 22 microfarad capacitor 66. Output pin $D_5$ is also connected to a 22 microfarad capacitor 62 which in turn is connected to ground. Input pin $C_9$ is connected to a one-tenth (0.1) microfarad capacitor 60, which in turn is connected to ground.

Voltage/temperature reference 68 sends an output reference signal to pin $C_4$ of analog-to-digital converter 40. Pin $E_3$ is another output pin of voltage/temperature reference 68. Pin $E_1$ connects to pin $E_2$ through a one-tenth (0.1) microfarad capacitor 70. Pin $E_2$ receives positive five volts from line 182, pin $E_1$ is grounded via analog ground node 48.

Figure 3:
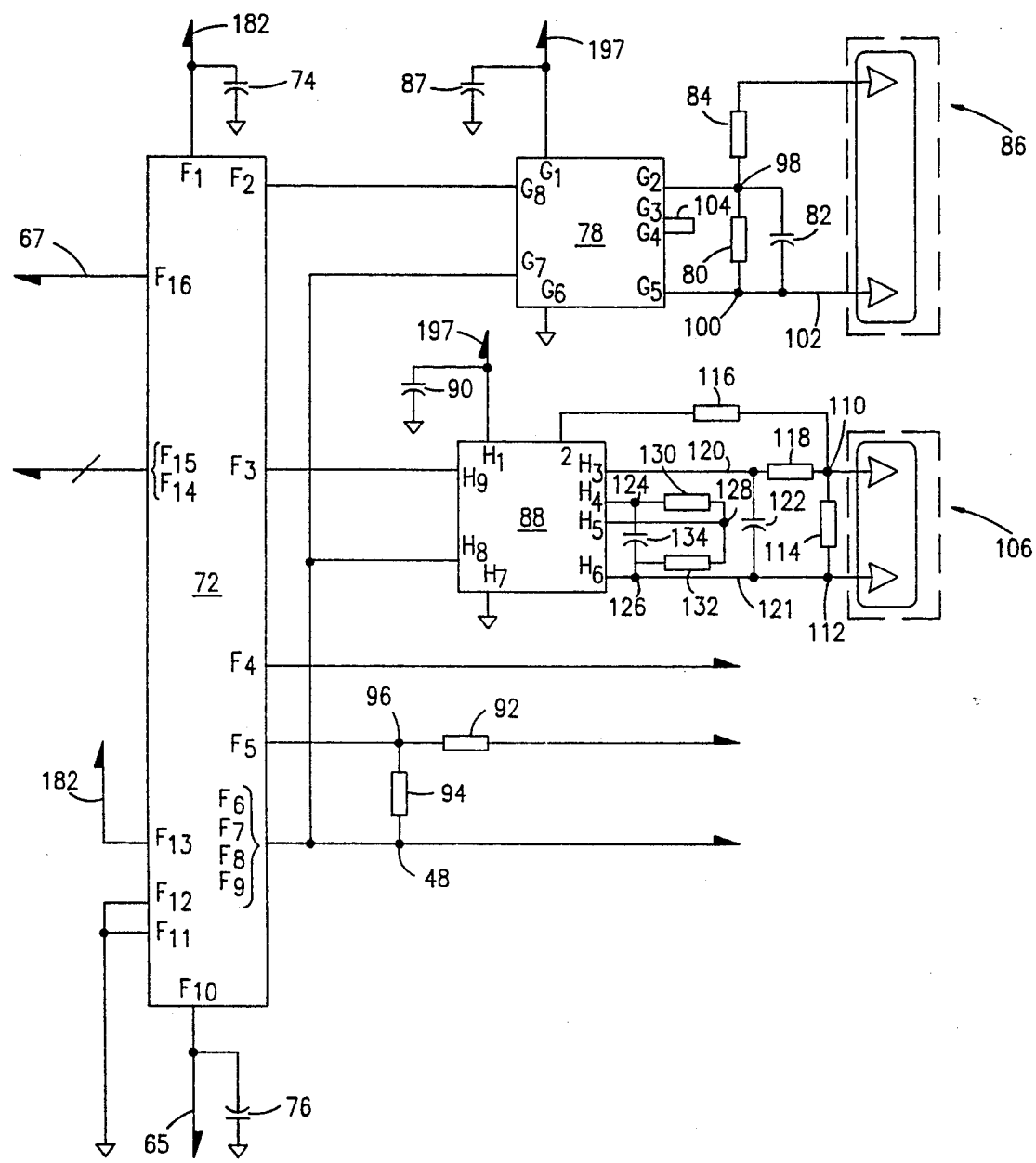
FIG. 3 is a schematic diagram of a portion of circuitry of the battery charge monitoring apparatus which, when fabricated, is preferably on a motherboard portion of the apparatus.

Referring to FIGS. 1 and 3, port $P_3$ of microprocessor 10 sends two signals to selection pins $F_{14}$ and $F_{15}$ of 8 to 1 analog multiplexer 72. Since, multiplexer 72 is an 8 to 1 multiplexer, there are three selection pins, $F_{13}$, $F_{14}$ and $F_{15}$, to determine which input signal will appear at output pin $F_{16}$. Since only four of the eight lines are in use, input pins $F_6$, $F_7$, $F_8$ and $F_9$ are connected to analog ground at node 48 and the most significant selection bit at pin $F_{13}$ receives five volts creating a logical "1".

Microprocessor 10 selects an input signal to appear at output pin $F_{16}$ by sending signals to the two least significant selection bits at pins $F_{14}$ and $F_{15}$. Eight to one analog multiplexer 72 sends the input signal selected by microprocessor 10 to output pin $F_{16}$ along line 67 all as shown in FIG. 3. From pin $F_{16}$, the output appears at pin $C_8$ of analog-to-digital converter 40.

Pins $F_{11}$ and $F_{12}$ are grounded. Pin $F_{10}$ is connected to negative five volts and is also connected to a one-tenth (0.1) microfarad capacitor 76, which is in turn connected to ground. Eight to one analog multiplexer 72 is powered by a positive five volt input received at pin $F_1$ via line 182. Pin $F_1$ also connects to a one-tenth (0.1) microfarad capacitor 74 which is in turn connected to ground. Pins $F_2$, $F_3$, $F_4$ and $F_5$ of multiplexer 72 receive the input signals.

Eight to one analog multiplexer 72 receives signals from pins $G_8$ and $H_9$ of isolation amplifiers designated generally 78 and 88 respectively. These two signals are received by eight to one analog multiplexer 72 through pins $F_2$ and $F_3$ respectively. Pin $F_4$ receives temperature input from pin $E_3$ of voltage/temperature reference 68. Voltage from the internal batteries designated generally 194 and 196 respectively in FIG. 4 passes through 2.74 megohm resistor 92 which connects to pin $F_5$. A 392K ohm resister 94 is between node 96 and node 48.

Isolation amplifier 78 receives input through pins $G_2$ and $G_5$. Pin $G_2$ connects to node 98 and $G_5$ connects to node 100.

A 6.2K ohm resistor 80 is in parallel with a one-tenth (0.1) microfarad capacitor 82 between nodes 98 and 100. A 1.8 megohm resistor 84 connects a terminal block designated generally 86 with node 98. Block 86 also connects to isolation amplifier 78 through line 102.

Pins $G_3$ and $G_4$ are connected by line 104. Block 86 is the physical interface connecting the internal circuitry to the batteries of the uninterruptible power supply system of interest.

Isolation amplifier 78 receives 15 volts at pin $G_1$ through line 197. Pin $G_1$ also connects to a one-tenth (0.1) microfarad capacitor, which in turn is connected to ground.

An isolation amplifier designated generally 88 receives 15 volts at pin $H_1$ from line 197 and is grounded at pin $H_7$. A one-tenth (0.1) microfarad capacitor 90 connects to ground, to 15 volts on line 197 and to pin $H_1$ of 88. A terminal block designated generally 106 connects to nodes 110 and 112. Block 106 is the physical interface connecting the internal circuitry to shunt voltage taken between two individual batteries of the uninterruptible power. Nodes 110 and 112 are connected by way of a one (1.0) K ohm resistor 114. Node 110 connects to pin $H_2$ through a 187K ohm resistor 116. Node 110 connects to pin $H_3$ through a 10K ohm resistor 118. Lines 120 and 121 are connected through a one-tenth (0.1) microfarad capacitor 122. Line 121 connects block 106 to pin $H_6$. A 100 picofarad capacitor 134 is between nodes 124 and 126. A 287K ohm resistor 130 is between nodes 124 and 128. A 2.87K ohm resistor 132 is between nodes 128 and 126. Pins $H_4$, $H_5$ and $H_6$ are connected to nodes 124, 128 and 126 respectively.

Figure 4:
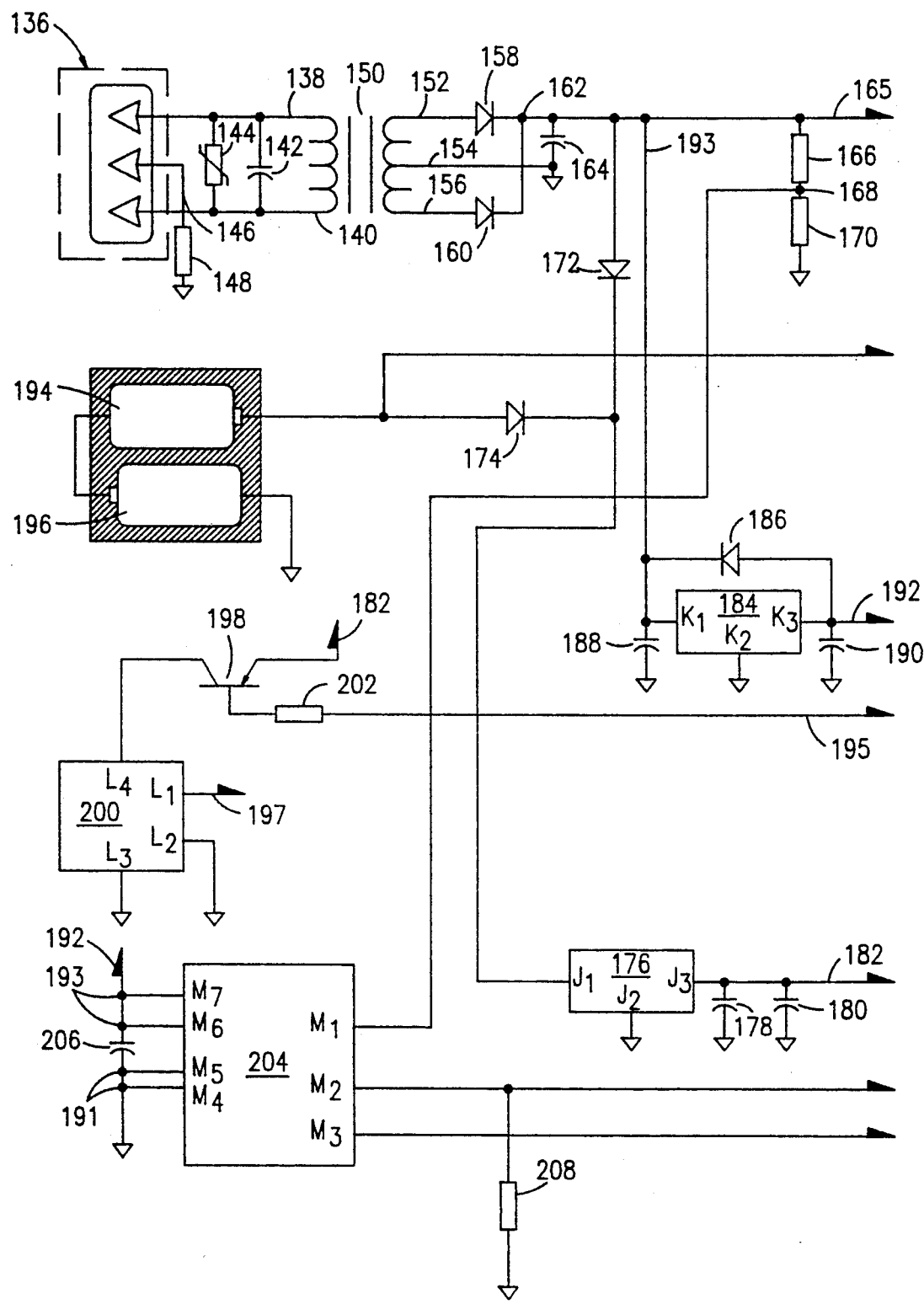
FIG. 4 is a schematic diagram of a portion of circuitry of the battery charge monitoring apparatus which, when fabricated, is preferably on a motherboard portion of the apparatus.

Referring to FIG. 4, a terminal block designated generally 136 provides a physical interface between the electric circuitry of the battery charge monitor apparatus and public utility power. A transformer designated generally 150 steps down the utility power input to the transformer on lines 138 and 140. A surge suppressor (MOV) designated generally 144 is in parallel with a one-tenth (0.1) microfarad capacitor 142; both are connected to lines 138 and 140. Using line 146, block 136 connects to ground through an 820K ohm resister 148. Line 154 is grounded. Lines 152 and 156 are connected to anodes of rectifying diodes designated generally 158 and 160. Cathodes of diodes 158 and 160 are connected at node 162, which in turn connects to line 165. A 1,000 microfarad capacitor 164 is between node 162 and ground. A 22K ohm resistor 166 is between nodes 162 and 168. A 10K ohm resister 170 is between node 168 and ground. The unregulated voltage and current along line 165 flow into coil 28 in block 24 of FIG. 1.

Two 3.6 volt, 5,000 milliampere, "C" size lithium batteries 194 and 196 are connected to 2.74 megohm resister 92 which in turn connects to pin $F_5$ of multiplexer 72 (FIG. 3). High resistance is necessary to prevent substantial discharge of current into multiplexer 72. If utility power is available, unregulated voltage turns rectifying diode 172 on and prevents a substantial discharge of current from batteries 194 and 196. Upon unavailability of utility power, rectifying diode 172 turns off and internal batteries 194 and 196 provide power to the apparatus through rectifying diode 174 which is on.

Line 193 carrying unregulated voltage connects node 162 with a one (1) amp five volt voltage regulator designated generally 184 at pin $K_1$. Voltage regulator 184 is grounded at pin $K_2$. The cathode of rectifying diode 186 is connected to line 193 and the anode of rectifying diode 186 receives output from pin $K_3$. A one-tenth (0.1) microfarad capacitor 188 is between pin $K_1$ and ground. A one-tenth (0.1) microfarad capacitor 190 is between pin $K_3$ and ground. Pin $K_3$ provides five volts DC at output line 192.

Voltage regulator 184 provides five volts along line 192 to circuitry only operated when utility power is available. The following circuitry receives 5 volts from line 192: audible alarm 22; chip 34; a power supply monitor designated generally 204; modem circuitry plugged into sockets designated generally 222 and 224; a 5 tap by 35 nanosecond delay line designated generally 234; on LCD display designated generally 236; and an octal buffer line driver from tactilely activated battery designated generally 238.

A low voltage regulator designated generally 176 receives input voltage from utility power or records internal battery power depending on the availability of utility power at pin $J_1$. The cathodes of rectifying diodes 172 and 174 are connected to pin $J_1$ of low voltage regulator 176. Low voltage regulator 176 is grounded through pin $J_2$. Output voltage of 5 volts appears at pin $J_3$.

A 100 microfarad capacitor 178, a 10 microfarad capacitor 180 and line 182 are connected in parallel at pin $J_3$. Voltage regulator 176 provides power to the following circuitry through line 182 regardless of availability of utility power: microprocessor 10; analog-to-digital converter 40; voltage invertor 64; 8-to-1 analog multiplexer 72; a PNP bipolar junction transistor 198; and a octal transparent latch designated generally 210. A 5 to 15 volt DC amplifier designated generally 200 supplies 15 volts to power amplifiers 78 and 88 along line 197. Pin $L_4$ of voltage amplifier 200 connects to the collector of PNP bipolar junction transistor 198. The emitter of PNP bipolar junction transistor 198 connects to five volts through line 182. The base of bipolar junction transistor 198 connects to 6.8K ohm resistor 202 which in turn is connected to pin $A_{11}$ of microprocessor 10. Microprocessor 10 controls chip 200 by controlling transistor 198 which connects to pin $L_4$ of chip 200. Microprocessor 10 instructs chip 200 to output 15 volts or 0 volts to line 197 which turns isolation amplifiers 78 and 88 on or off. Pins $L_2$ and $L_3$ are grounded.

Pin $M_1$ of power supply monitor 204 is connected to node 168. Pin $M_2$ is in series with a 10K ohm resistor 208 which in turn is connected to ground. Pin $M_3$ sends a signal to pin $S_6$ of a socket designated generally 222 in FIG. 6. This signal resets the modem when utility power becomes available. Power supply monitor 204 outputs a signal through pin $M_2$ which notifies the microprocessor as to the availability of utility power at pin $A_{12}$. Pins $M_4$ and $M_5$ are grounded at node 191. Pins $M_6$ and $M_7$ are connected to five volts provided by line 192 at node 193. A one-tenth (0.1) microfarad capacitor 206 is between nodes 191 and 193

Figure 5A:
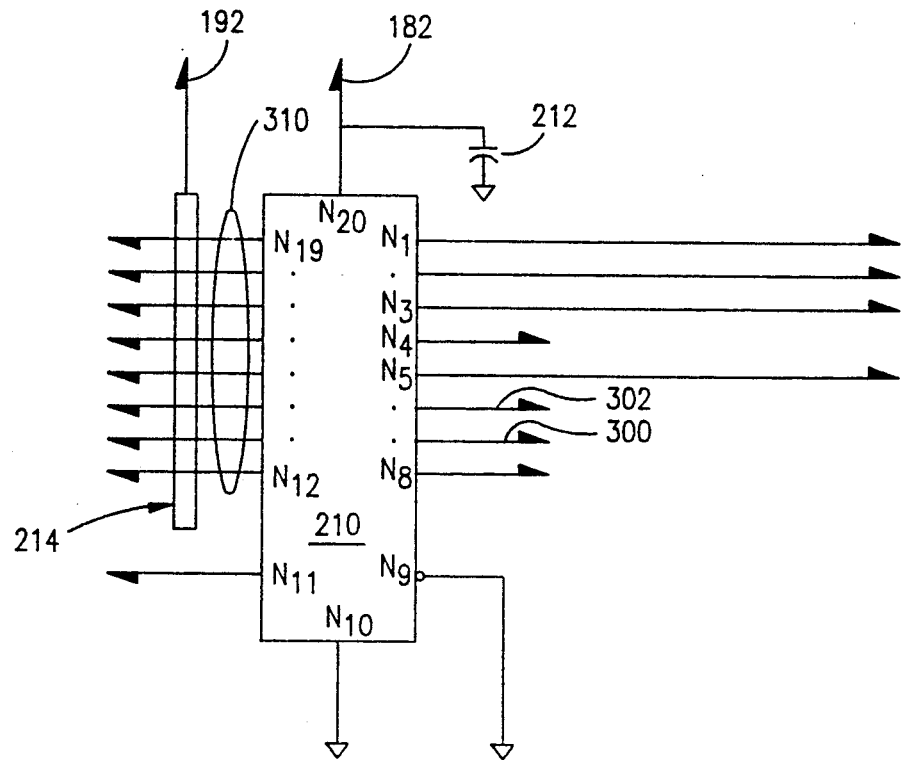
FIGS. 5a and 5b are schematic diagrams of portions of circuitry of the battery charge monitoring apparatus which, when fabricated, are preferably on a motherboard portion of the apparatus.

Octal latch 210 (FIG. 5a) is grounded at pins $N_9$ and $N_{10}$. Octal latch 210 receives power at pin $N_{20}$ from line 182. Line 182 is also connected to a one-tenth (0.1) microfarad capacitor 212 which in turn is connected to ground. Pins $N_4$ and $N_8$ are not connected. Pin $N_5$ of octal transparent latch 210 enables modem socket designate generally 222 at pin $S_{14}$. Pin $N_{11}$ is the address latch enable which receives directions from pin $A_3$ of microprocessor 10, also as shown in FIG. 5a. By using the address latch enable, microprocessor 10 commands transparent latch 210 to receive or output information. Pins $N_{12}$ through $N_{19}$ represent the connection to the address data bus designated generally 310. Eight (8) 10K ohm pullup resistors 214 are connected to pins $N_{12}$ through $N_{19}$.

Figure 5B:
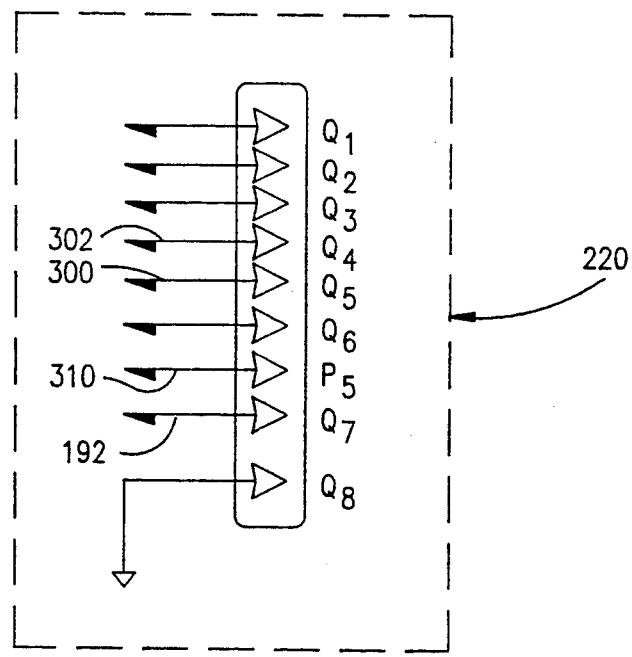
Figure 7:
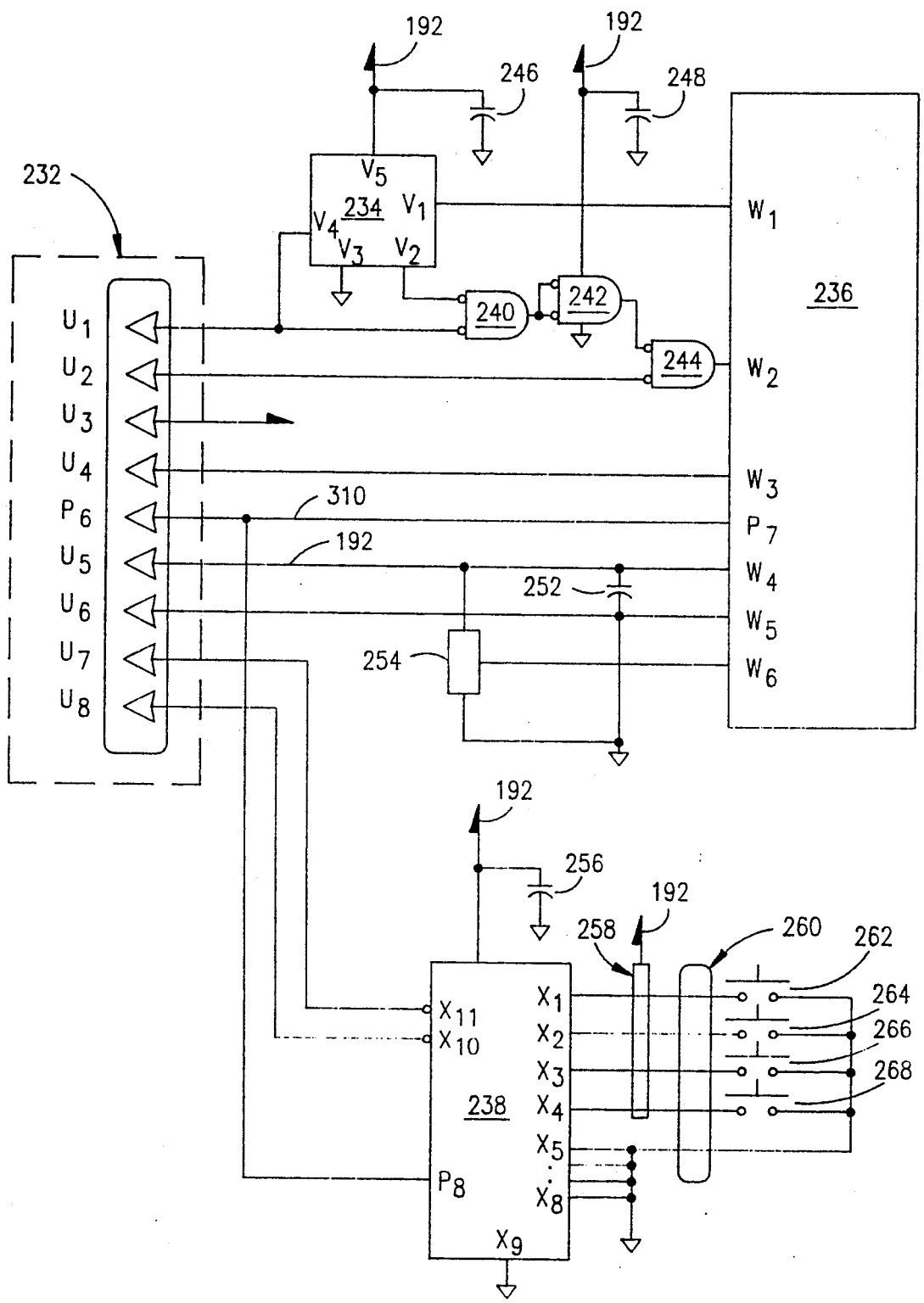
FIG. 7 is a schematic diagram of a portion of circuitry of the battery charge monitoring apparatus which, when fabricated, is preferably on a daughterboard portion of the apparatus.

An interface designated generally 220 in FIG. 5b connects the motherboard circuitry to the daughterboard circuitry via an interface designated generally 232 in FIG. 7. Interface 220 is grounded at pin $Q_8$ and receives power to pin $Q_7$ through line 192. Pins $Q_4$ and $Q_5$ of interface 220 connect display line 302 and key pad line 300 from the daughterboard to octal buffer 210 at pins $N_6$ and $N_7$ respectively. Display line 302 and keypad line 300 are the enabling lines for a four (4)-line 20 character LCD with controller designated generally 236 and keypad 238. Pin $Q_3$ of interface 220 connects pin $A_5$ of microprocessor 10 to pin $U_3$ of operator interface 232 of the circuitry shown in FIG. 7 which is preferably mounted on a daughterboard.

Several chips on the motherboard are connected and receive or output information along the same lines. The lines connecting port $P_1$ of microprocessor 10, pins $N_{12}$ through $N_{19}$ of octal buffer latch 210, and pin $P_{11}$ of socket 222 are called the address and data bus lines and are collectively designated generally 310. The address and data bus connect from the motherboard to the daughterboard through port $P_5$ interface of 220 and port $P_6$ of interface 232.

Pins $N_1$, $N_2$ and $N_3$ of latch 210 send signals to pins $S_{17}$, $S_{16}$ and $S_{15}$ of socket 222 to access information from the modem which is then output to the address data bus 310 from port $P_{11}$. Pin $N_1$ connects to pin $Q_6$ of interface 220 which in turn connects to pin $U_4$ of interface 232. Pin $U_4$ connects to pin $W_3$ of LCD display 236. This signal accesses information from LCD display 236. The LCD display outputs the requested data from port $P_7$ to address data bus 310.

Figure 6:
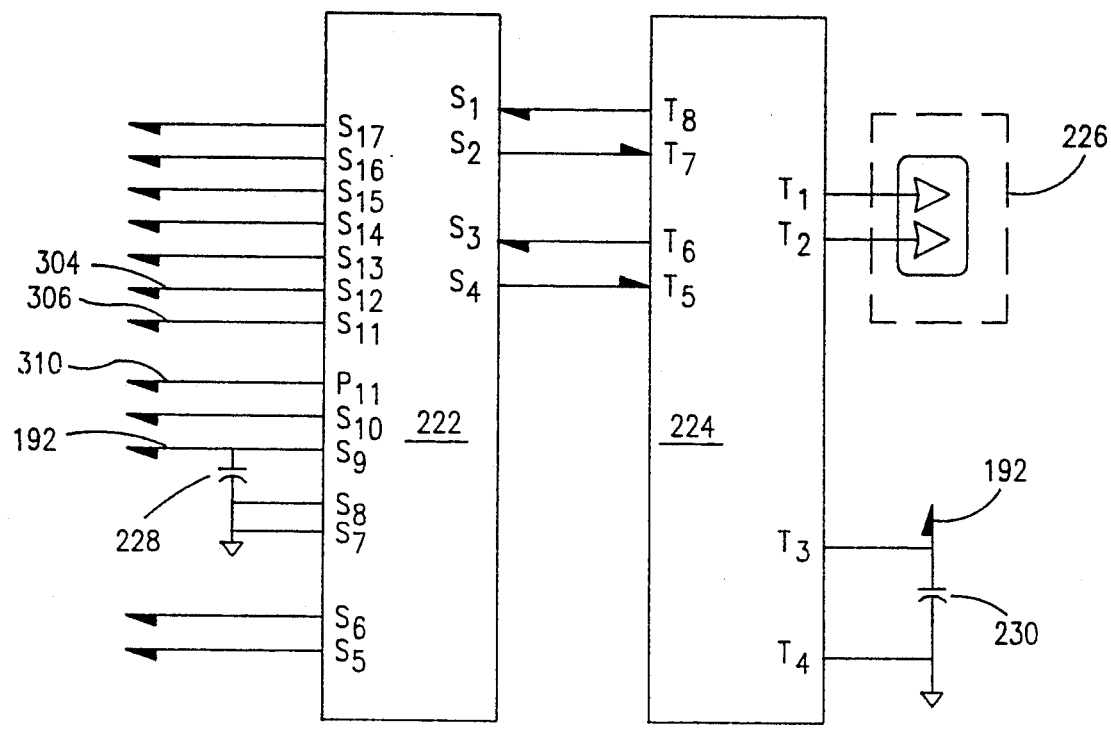
FIG. 6 is a schematic diagram of a portion of circuitry of the battery charge monitoring apparatus which, when fabricated, is preferably on a motherboard portion of the apparatus.

Referencing FIG. 6, pins $T_5$ through $T_8$ of socket 224 connect to pins $S_4$ through $S_1$ of socket 222. SIMM Socket 224 receives five volts at pin $T_3$ through line 192 and is grounded at pin $T_4$. Pin $T_3$ is connected to pin $T_4$ by a 10 microfarad capacitor. Socket 222 is powered by five volts at pin $S_9$ through line 192. Pins $S_8$ and $S_7$ are grounded. Pin $S_9$ is connected to pins $S_8$ and $S_7$ by a 10 microfarad capacitor 228. Pin $S_6$ connects to pin $M_3$ of power supply monitor 204 which resets any modem attached to socket 222 when utility power is available.

Pin $A_1$ of microprocessor 10 connects to pin $S_{12}$ of socket 222 and the interface 220 along line 304. Pin $A_2$ of microprocessor 10, pin $S_{11}$ of socket 222 and pin $Q_2$ of interface 220 are connected along line 306. Pins $Q_1$ and $Q_2$ of interface 220 are connected to the daughterboard mounted circuitry at pins $U_7$ and $U_1$. Lines 304 and 306 are the read and write lines. Microprocessor 10 uses the read line to signal the modem to read input lines. Microprocessor 10 also uses read line 304 to signal buffer 238 to read from its input lines $X_1$ through $X_4$. The data retrieved from the input lines is output through port 8 of buffer 238. Microprocessor at pin $A_2$ outputs to write line 306 a command to the modem plugged into socket 222 at pin $S_{11}$ to output data at port $P_{11}$. Microprocessor 10 also uses line 306 to command LCD 236 to display data.

Referring to FIG. 7, pin $U_1$ of interface 232 connects to one input of an NOR gate 240 and pin $V_4$ of a 5 tap by 35 nanosecond delay line designated generally 234. Pin $V_3$ is grounded. Delay line 234 is powered by five volts from line 192 at pin $V_5$. Pin $V_5$ is also connected to a one-tenth (0.1) microfarad capacitor 246 which is, in turn, connected to ground. Pin $V_1$ of 234 is connected to pin $W_1$ of 236. Pin $V_2$ connects with both input of NOR gate 240. Output of NOR gate 240 connects with both inputs of NOR gate 242. NOR gate 242 receives five volts input from line 192. NOR gate 242 is connected to line 192 to a one-tenth (0.1) microfarad capacitor 248 which is, in turn, connected to ground. The inputs of NOR gate 244 comprise the output Of NOR gate 242 and pin $U_2$ of operator interface 232. The output of NOR gate 244 is connected to pin $W_2$ of LCD 236.

Pins $U_4$ through $U_7$ and port $P_6$ of operator interface 232 connect with pins $W_3$ through $W_5$ and port $P_7$ of LCD 236. Pin $U_7$, pin $U_8$ and port $P_6$ of interface 232 are connected to pins $X_{11}$, $X_{10}$ and port $P_8$ of buffer 238 respectively. Pins $U_5$ and $U_6$ are connected by a 10 microfarad capacitor 252. Pins $W_4$ and $W_5$ of LCD 236 connect with the same capacitor. Pin $U_6$ of interface 232 pin $W_5$ of LCD 236 and pin $W_6$ of LCD 236 are connected to ground. Pin $U_5$ is connected to a 20K ohm resistor 254 which, in turn, is connected to ground. Capacitor 252 and resistor 254 are in parallel.

Pins $X_5$ through $X_8$ of buffer 238 are grounded. Pins $X_1$ through $X_4$ are connected to resistor block designated generally 258 which receives voltage from line 192. Pins $X_1$, $X_2$, $X_3$ and $X_4$ are further connected to a 5 position connecter, commonly known as a header, designated generally 260. Pins $X_1$ through $X_4$ are further connected to switches 262, 264, 266 and 268, respectively. Switch 262 is for scroll. Switch 264 moves the display up. Switch 266 moves the display down. Switch 268 is "enter".

The battery cycle monitor is an electronic device used to monitor the status of an uninterruptible power system. The monitoring hardware provides the physical interface between the uninterruptible power supply system and a computing device. Utility power supplies necessary power to the battery cycle monitor under normal operating conditions. Upon unavailability of utility power, an internal battery provides the power.

Preferably these are seven preset startup parameters for the battery cycle monitor including invoice number under which the battery cycle monitor was sold, representative number for a sales representative for the customers of the uninterruptible power system, type of cells used in the uninterruptible power supply system, number of the shunt connector used in the uninterruptible power supply system from which the input voltage is received, customer number, the number of the cells in the uninterruptible power system and the type of warranty on the uninterruptible power system.

The battery cycle monitor apparatus stores and retrieves data concerning the operation of the uninterruptible power supply system. During normal operation, when utility powered, the battery cycle monitor continuously monitors battery string voltage, battery shunt current and temperature to determine if one of these variables is changing. If the magnitude of the change reaches a predetermined value, the battery cycle monitor interprets this change (in uninterruptible power supply system status) as an "event". Each time an event occurs, the battery cycle monitor apparatus collects and stores certain predetermined information associated with the event in the battery cycle monitor non-volatile memory.

This event recording process continues throughout the life of the uninterruptible power supply system. If during operation no "events" are occurring, the battery cycle monitor does not store any information in memory. When utility power is disrupted, the battery cycle monitor continues to operate (providing the internal batteries have sufficient capacity.) Loss of utility power causes the battery cycle monitor to perform periodic scans of the variables which are indicative of the operating parameters of the battery portion of the uninterruptible power supply, rather than continuous scans. Periodic scans extend internal battery life.

The battery cycle monitor contains alarm contacts which operate only when utility power is available. During normal operation with utility power, these alarm contacts remain open. Interruption of utility power or occurrence of an "event" causes the alarm contacts to close. If a remote alarm is connected to the alarm contacts of the battery cycle monitor, the closed alarm contacts trigger the remote alarm. The remote alarm preferably has a means for silencing itself.

The battery cycle monitor apparatus and method of the invention permits the manufacturer (or user) to input predetermined programmable parameters. Comparison of predetermined programmable parameters to monitored input variables determines whether an event is in progress. If an event occurs, the battery cycle monitor apparatus records the event in the non-volatile memory of the apparatus. The predetermined programmable parameters include: nominal link voltage (measured in volts); float deviation (measured in volts); rated current (measured in amps); discharge deviation (measured in amps); rated power (measured in kilowatts); power deviation measured in kilowatts; nominal temperature (measured in Fahrenheit); and temperature deviation (measured in Fahrenheit).

The nominal link voltage represents the normal battery string voltage in the uninterruptible power supply. When battery string voltage differs from nominal link voltage by more than a selected float voltage deviation value, the battery cycle monitor defines a "float event" to be in progress.

When battery shunt current is less than zero by the preselected programmable parameter discharge deviation and battery string voltage is lower than nominal by the float deviation, the battery cycle monitor defines a "discharge event" to be in progress. During a discharge event, if the power changes by the programmable parameter power deviation, the battery cycle monitor creates a new record. It is preferable that the value exceed 2% of rated power.

Nominal temperature represents the normal ambient temperature of the room in which the battery cycle monitor is located. When the temperature deviates from nominal temperature by the preselected programmable parameter temperature deviation, the battery cycle monitor defines a "temperature event" to be in progress.

The battery cycle monitor defines nineteen different conditions as events of various kinds, and stores each event in memory in the form of a record. Table I below sets forth the nineteen (19) different conditions which define "events":

TABLE 1

| Number | Event | Test | Stored Information |
|---|---|---|---|
| 0 | Performed RESET initialize. | NA | RID - DAT |
| 1 | Internal battery voltage low. | <5.30 V | RID - DAT - Vbat |
| 2 | Internal battery voltage OK. (After event 1.) | >5.9 V | RID - DAT - Vbat |
| 3 | Utility power source lost. | <90 VAC | RID - DAT |
| 4 | Utility power restored. (After event 3.) | >100 VAC | RID - DAT |
| 5 | Internal diagnostic failure. | NA | RID - DAT - Failure code |
| 6 | UPS shunt input disconnect. | Vshunt > 21.0 mV | RID - DAT |
| 7 | UPS voltage input disconnect. | Vstring < 50 V | RID - DAT |
| 8 | UPS shunt input connect. (After event 6.) | Vshunt < 20.0 mV | RID - DAT |
| 9 | UPS voltage input connect. (After event 7.) | Vstring > 75 V | RID - DAT |
| 10 | UPS voltage change from nominal during float. (Ishunt ≧ 0) | Vstring > or < NCM ±DEV | RID - DAT - Vstring - Ishunt - |
| 11 | UPS voltage return to nominal. Only after event 10. (Ishunt ≧ 0) | Vstring within NCM ±DEV/2 | RID - DAT - Vstring - Ishunt - min or max Vstring, (based on excursion sign) |
| 12 | Start of UPS battery discharge. | Ishunt < DEV & Vstring < NOM-DEV | RID - DAT - Vstring - Ishunt |
| 13 | Change in discharge power from start of event 12 or from last event 13. Only during event 12. | ΔPower > DEV & \|dP/dt\| < 2% (NCM W) | RID - DAT - Vstring - Ishunt |
| 14 | End of UPS battery discharge. (Information just before end of discharge. Only after event 12.) | Ishunt > 0 | RID - DAT - Vstring - Ishunt - Ishunt max - Total Ahrs - Total kWhr |
| 15 | UPS voltage return to nominal. (Only after event 14.) | Vstring > NCM ⅔ DEV & Ishunt ≧ 0 | RID - DAT - Vstring - Ishunt |
| 16 | Start of temperature excursion. | T > or < NCM ± DEV | RID - DAT - T |
| 17 | Change in temperature from start of event 16 or from last event 17. Only during event 16. | ΔT > DEV | RID - DAT - T |
| 18 | End of temperature excursion. Only after event 16. | T within NCM ± 4° F. | RID - DAT - T - min or max T, (based on excursion sign) |

These nineteen different events are assigned the predetermined event record identification numbers, from "0" to "18". The record identification number is stored by the battery cycle monitor software in each record so that the battery cycle monitor software may recognize the type of event stored in a particular record. Table 1 shows the record identification number in column 1 for each event defined in column 2. The test used to detect an event appears in column 3. The abbreviation "NOM", which is found in column 3, stands for nominal. The abbreviation "DEV", which is found in column 3, stands for deviation. The abbreviation "W", which is found in column 3, stands for watts. When the input variables satisfy one of the tests in column 3, the battery cycle monitor software identifies the type of event, collects information concerning the input variables, and stores the information which appears in column 4. The battery cycle monitor stores this information in a record in a file called EVENT DAT. The abbreviation "RID", which is found in Column 4, stands for record identification. Abbreviation "DAT", which is also found in column 4, stands for date and time.

When an operator resets the battery cycle monitor apparatus, the battery cycle monitor apparatus stores the date, the time and the record identification number "0" in a single record as indicated in column 4 of Table 1.

The battery cycle monitor apparatus examines the condition of the battery cycle monitor apparatus backup internal batteries 194, 196 and the availability of utility power. If internal battery voltage decreases below a preselected value 5.3 volts (which may be changed), the date, time and voltage of the backup internal batteries 194, 196 are recorded in memory along with the record identification number "1". If backup internal battery voltage falls below 5.3 volts and thereafter increases to a value greater than 5.9 volts, the battery cycle monitor apparatus stores the date, time, new backup internal battery voltage and record identification number "2" in memory. If utility power is less than 90 volts AC, the battery cycle monitor apparatus assumes that utility power has been lost and records the date and time of the loss of utility power as per record number "3".

Once the battery cycle monitor experiences more than 90 volts AC, the battery cycle monitor software assumes that utility power has been restored. In response, the apparatus stores the date and time of the restoration of utility power as well as the record identification number "4" which is assigned to this event.

Record identification number "5" represents an internal diagnostic failure of battery cycle monitor. Each of the three predetermined internal diagnostic failures receives a single digit failure code (1, 2 or 3). The internal diagnostic failure along with their codes are as listed below:

| Code | Failure |
| --- | --- |
| 1. | The modem failed to answer a call or the modem answered the call and did not receive a carrier or Data Set Ready ("DSR"). When this diagnostic failure occurs the modem is re-initialized. |
| 2. | The modem was reinitialized when its installation codes were found to be corrupted. |
| 3. | The modem answered a call and received an illegal login sequence. This code indicates an attempted unauthorized access. |

When one of these internal diagnostic failures occurs, the date and time of the diagnostic failure along with the failure code and record identification number "5" are recorded.

Disconnection and reconnection of the uninterruptible power supply system selected shunt input and uninterruptible power supply system battery string voltage 86 (in FIG. 3) to input the battery cycle monitor are also events. If the voltage across the shunt exceeds 21 millivolts, the battery cycle monitor recognizes that a shunt input is disconnected from the uninterruptible power supply system and records the date and time of shunt input disconnection as well as event record identification number "6".

When shunt voltage decreases below 20 millivolts after a shunt input disconnection event, the battery cycle monitor software assumes that the shunt input has been reconnected and stores the date, time and record identification number "8". If the uninterruptible power supply system battery string voltage decreases below 50 volts, the battery cycle monitor software considers the battery string input disconnected and records the date, time and record identification number "7". When the battery string voltage exceeds 75 volts after a battery string input disconnection event, the battery cycle monitor considers the uninterruptible power supply system battery string input to have been reconnected and stores the date, time and includes record identification number "9".

The battery cycle monitor determines whether a battery string voltage deviation occurs by noting the uninterruptible power supply system shunt current and uninterruptible power supply system battery string voltage 86 in FIG. 3. If shunt current is greater than or equal to zero and battery string voltage exceeds the sum of a predetermined nominal voltage and a predetermined float voltage deviation, the battery cycle monitor interprets these readings as a battery string voltage deviation event. If the shunt current is greater than or equal to zero and the battery string voltage is less than the arithmetic difference between the predetermined nominal voltage and the predetermined float voltage deviation, the battery cycle monitor software also interprets these readings as a battery string voltage deviation event. Upon the battery cycle monitor detecting a battery string voltage deviation event, the battery cycle monitor apparatus stores the date, time, uninterruptible power supply system battery string voltage, uninterruptible power supply system battery string current with event record identification number "10" in memory.

When the battery string voltage returns to a voltage within the range defined by the predetermined nominal voltage and the predetermined float deviation voltage, the battery cycle monitor considers this as an event marking the end of the battery string voltage deviation. The range of voltages preferably includes the nominal voltage plus or minus ½ of the float deviation voltage. When the battery string voltage falls within this range, the time, date, battery string voltage, battery string current and record identification number "11" are stored in memory.

The battery cycle monitor software calculates the maximum or minimum battery string voltage which occurred between events "10" and "11". If battery string voltage was greater than nominal float voltage when event "10" occurred, the battery cycle monitor software calculates maximum battery string voltage. If battery string voltage was less than nominal float voltage when event "10" occurred, the battery cycle monitor calculates minimum battery string voltage. The maximum or minimum value is stored as a variable defining event "11".

Commencement of current discharge from the uninterruptible power supply system is an event. The battery cycle monitor considers a discharge event in progress when the following two conditions are satisfied: (1) The shunt current is less than zero by more than the predetermined discharge current deviation and (2) battery string voltage is less than the difference between predetermined nominal string voltage and predetermined float voltage deviation. The positive or negative sign given to shunt current represents direction of current flow. (Charging shunt currents are positive; discharging shunt currents are negative.) The predetermined discharge deviation must have value greater than zero. Upon occurrence of these two conditions, date, time, battery string voltage, and shunt current with record identification number "12" are stored in one record.

An event is deemed to occur after the uninterruptible power supply system discharges current if the following two conditions are satisfied: (1) The predetermined rated power of the system changes by an amount greater than the predetermined power deviation and (2) the derivative of power with respect to time is less than 2% of predetermined nominally rated power. If these two conditions are satisfied, the battery cycle monitor software stores time, date, battery string voltage, shunt current with record identification number "13". The derivative of power with respect to time must be less than 2% of nominal power to give the uninterruptible power supply system a chance to settle out and provide power at a constant level. The initial power reference is the power two (2) seconds after start of the discharge event. The new base value for future deviations is power at the last deviation.

Upon conclusion of uninterruptible power supply system battery discharge, the battery cycle monitor apparatus records date, time, battery string voltage, shunt current, total amp hours during discharge, total kilowatt hours during discharge with record identification number "14" in one record; these data are collected when power first starts to decrease towards zero. While the uninterruptible power supply system is discharging, a record of maximum shunt current is kept. After discharge terminates, the battery cycle monitor stores the maximum shunt current during the discharge with the other information of event "14". The uninterruptible power supply system battery discharge is considered terminated when current in the shunt is greater than zero.

After termination of uninterruptible power supply system battery discharge, a record is stored in memory if the shunt current is greater than or equal to zero and battery string voltage exceeds the difference between the predetermined nominal voltage and 75% of the predetermined float voltage deviation. In such case the date, time, battery string voltage, shunt current and record identification number "15" are included in that stored record.

The battery cycle monitor records three events involving changes in temperature. When temperature deviates from the predetermined nominal temperature by an amount greater than the predetermined temperature deviation, the battery cycle monitor defines a temperature event to be in progress. Upon detection of a temperature deviation, the battery cycle monitor stores time, date, temperature and record identification number "16" in memory.

Event "16" begins a temperature excursion. If there is another temperature change during the temperature excursion which is greater than the predetermined temperature deviation, the date, time, new temperature with record identification number "17" are stored.

The previously recorded temperature is used as a reference in determining whether a change in temperature greater than the predetermined temperature deviation had occurred. During the temperature excursion, the temperatures are being compared to identify the minimum or maximum temperature. Once the temperature comes within the nominal temperature plus or minus 4° Fahrenheit, the battery cycle monitor considers the temperature excursion ended. The battery cycle monitor stores the date, time, temperature, minimum or maximum temperature obtained during the excursion with record identification number "18" in one record.

The information accumulating in the battery cycle monitor non-volatile memory can be extracted for analysis at any time. There are three methods of extracting this information from the battery cycle monitor. First, qualified service personnel may use a portable computer to retrieve the information by connecting to the communication port and running the proper software. Second, the procedure can be performed remotely if the optional modem is installed. Third, when the optional operator interface is installed, the summary information can be viewed on LCD 236 or sent to chip 34 which is connected to the COM port.

An operator interface referred to generally a OPINT is available for the standard unit which adds a four line by twenty column LCD and a four key pad. The interface consists of an alphanumeric display and four keys. The "C" key allows the user to navigate through a series of menus. The "Up" and "Down" keys allow the user to select the submenu item. The "Enter" key selects a menu item.

When one of the keys is pressed, internal audible alarm 22 in FIG. 1 sounds briefly to acknowledge key press. If a key is pressed but does not provide a function at the current menu level, a second beep sounds when the key is released.

The battery cycle monitor software scans the input variables while using OPINT. If OPINT is left idle in a menu other than the display of real time variables, the battery cycle monitor will gradually return to this display. OPINT is operational only when utility power is available to the battery cycle monitor; when the battery cycle monitor operates on its internal battery, OPINT cannot be used. FIG. 19 illustrates a preferred embodiment of the battery cycle monitor OPINT front panel.

Table 2, set forth below, defines some parameters that appear on the menus operators use to interface with the battery cycle monitor.

TABLE 2

| | |
|---|---|
| Nominal link Voltage | This is the normal battery string float voltage. |
| Float deviation | When the battery string voltage differs from nominal by more than this deviation value, the BCM considers a FLOAT event in progress. The value must be greater than three. Float deviation is also a factor in a DISCHARGE event. |
| Rated current | This is the rated current of the system. |
| Discharge deviation | When the shunt current is less than zero by this amount and the battery string voltage is lower than nominal by the float deviation, the BCM considers a DISCHARGE event in progress. The discharge deviation must be greater than zero. |
| Rated power | This is the rated power of the system. |
| Power deviation | During a DISCHARGE event, if the power changes by this amount the BCM will record a new record. The value must be greater than 2% of rated power. |
| Nominal temperature | This is the normal ambient temperature. |
| Temperature deviation | When the temperature deviates from nomial by this amount, the BCM considers a TEMPERATURE event in progress. The value must be greater than four. |

Normally the LCD displays real time input variables until the operator selects another menu. Therefore, the LCD displays date, time, battery string voltage, battery current and ambient temperature. During an event, the event type is indicated at the bottom of the LCD display.

The operator, by selecting menus, has the option of viewing battery cycle monitor memory usage, voltage of internal backup batteries, configuration of the battery cycle monitor software and the summary report. If a serial printer is connected to the battery cycle monitor COM port, an operator can command the battery cycle monitor to output (to a printer) an event summary report and a setup summary report. The printer should support preferred serial RS232C communication at 9600 baud, eight data bits, no parity and no busy protocol.

If the printer is disconnected from the communication or COM port, the COM port may be used for communication between the battery cycle monitor apparatus and a host computer that is an MS DOS system.

The COM port is preferably a standard port that supports transmit data, receive data and signal ground. The COM port is operational only when utility power is provided to the battery cycle monitor. The COM port does not need to be permanently wired unless the COM port is used frequently. The connector for the COM port is preferably a six position RJ11, typical of phone jacks and is marked COM. Any six conductor phone cable can be used to connect the battery cycle monitor.

To use the COM port to communicate with battery cycle monitor apparatus, the DOS program BCM.EXE is used. This program has built-in access codes for communicating with the battery cycle monitor apparatus. The battery cycle monitor apparatus does not scan input variables while in a COM port session. The battery cycle monitor apparatus gives full attention to the device connected to the COM port. If the COM port is left idle in a menu, the battery cycle monitor will gradually return to a state of no COM port session and begin scanning the input variables.

Figure 20:
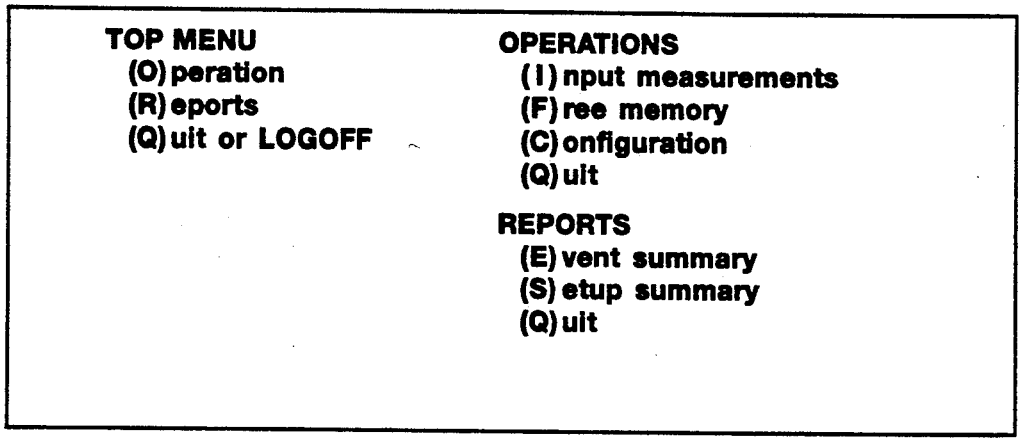

When using the battery cycle monitor COM port and the host program, the battery cycle monitor apparatus presents a menu driven interface the user can navigate to obtain information about battery cycle monitor status and to change battery cycle monitor parameters. FIG. 20 shows the menus available during a COM port session with the battery cycle monitor apparatus. To select a menu option, the user types the letter enclosed in parenthesis for that option. The battery cycle monitor prompts for a selection from the user with the message "Enter a Command. [O,RQ]?". The letters enclosed in square brackets are a possible option of characters to type. For instance, to select (O)peration from the TOP MENU, the operator types an 'O'. The TOP MENU has options operation, reports and quit or log off.

Choosing option operation allows further options for checking the operational status of the battery cycle monitor. The reports option provides access to two reports that give information about events the battery cycle monitor has recorded or a summary of the setup information in the battery cycle monitor. The last option, quit or log off, completes the user's session with the battery cycle monitor and the battery cycle monitor returns to normal operation.

Within the operations menu the user can select three different options that give information on the status of the battery cycle monitor. Choosing input measurements displays values of current input variables at the top of the screen. $V_{bastrg}$ and $I_{shunt}$ are displayed followed by temperature and voltage of the internal backup batteries. To return to the operations menu, the operator presses any key.

Figure 21:
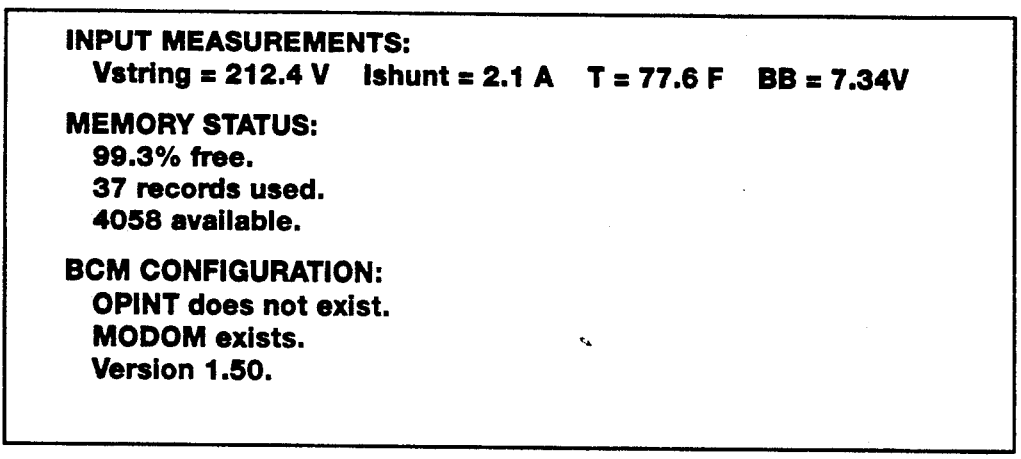

When the free memory option is chosen, the battery cycle monitor displays a status message about its event storage space. The number of free records available is calculated using an average record size. The actual number of records remaining may vary from this estimate. The number of records used is also shown in this display. The configuration option displays a message about the battery cycle monitor hardware and software. The message tells whether the operator interface, i.e. OPINT, or the modem is installed and also the version of the software being used. These displays of these three options are shown in FIG. 21.

Figure 22:
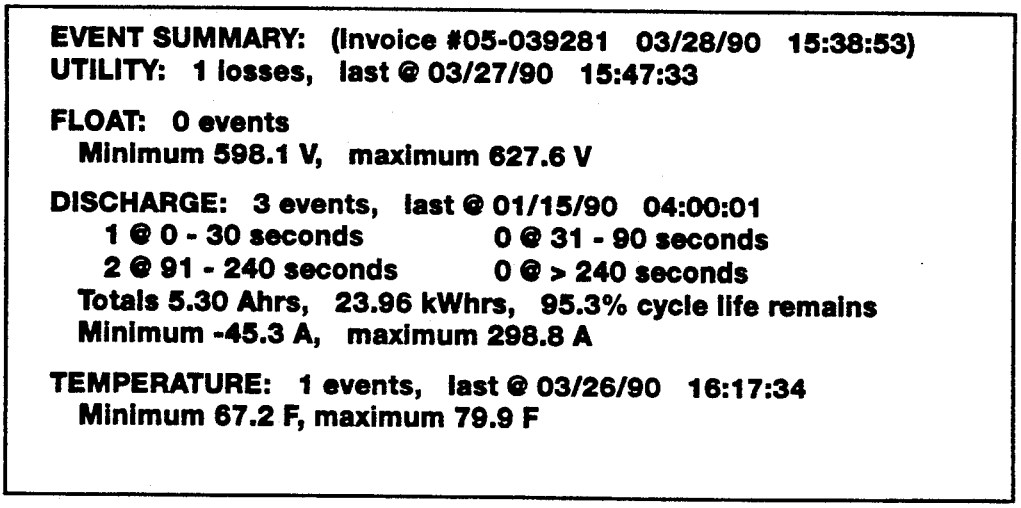

The event summary option in the reports menu allows the user to view information about the event records that have been stored. A typical record summary is shown in FIG. 22. The number of utility losses is listed first along with the date and time of the last utility loss. The number of float, discharge and temperature events is then given along with the date and time of the last event. For each input variable, the minimum and maximum value is listed below the number of events. Discharge events are sorted based on length of the event. The setup summary option displays a screen of startup and programmable parameters. These parameters determine how the battery cycle monitor decides whether an event has occurred. This report as shown in FIG. 23.

The same communication process between the computer and the battery cycle monitor through the COM port can be performed remotely if the optional modem is installed. The optional modem gives the battery cycle monitor a remote COM port. The modem interface allows access to the battery cycle monitor from a distant location. It consists of a printed circuit board with the modem electronics and a second printed circuit board with the telephone line interface. A Bell 212A compatible modem can be added to the main printed circuit board.

Addition of the modem allows remote access to information stored in the battery cycle monitor. The battery cycle monitor automatically recognizes presence of the modem and executes program code to utilize the modem if present. The modem may consist of two small printed circuit boards that plug into sockets on the main printed circuit board.

The battery cycle monitor does not scan the input variables while in modem session. The battery cycle monitor gives full attention to the modem. If the modem line is left idle in a menu, the battery cycle monitor will gradually return to a state of no modem session, hang up the telephone and begin scanning the input variables. The modem option also makes remote diagnostics and software updates possible. The modem is operational only when utility power is available to the battery cycle monitor. While operating on the backup internal batteries, the modem cannot be used.

When the modem is installed, the battery cycle monitor answers a telephone ring automatically and provides remote access to the battery cycle monitor information. To utilize the modem, an IBM or compatible personal computer PC with a Hayes TM compatible modem is preferred at the remote location. The remote user runs the program BCM.EXE which operates as if the user were connected directly to the remote battery cycle monitor COM port. The same menu interface described in the communication port discussion is available when using the BCM.EXE program.

The battery cycle monitor program facilitates access to the battery cycle monitor through the COM port or via modem. The selections the program offers are the same for either access method; for modem access, a telephone number is required. For the remote access options to be available, a special command line parameter must be entered when the battery cycle monitor is run. FIG. 24 shows the command line parameters. The menu selections for the BCM.EXE program are illustrated in FIG. 25.

The report retrieval options operate automatically without any user interaction. The BCM.EXE program initiates a session with the monitor, gets the specified report and writes it to disk. The reports are always placed in files that have fixed filenames. The event records are placed in EVENTS.DAT, the event summary is placed in EVENTS.SUM and the setup summary is placed in SETUP.SUM.

To run the battery cycle monitor program, at the DOS prompt the user types BCM<enter>. To simplify use of the program and allow completely unattended operation, command line parameters can be specified. The command line parameters are shown in FIG. 26. The parameters must be separated by spaces and begin with '-'. The parameters supported are listed in the following Table 3:

TABLE 3

| Command Line Parameter | Description |
| --- | --- |
| -re | Enables the remote access options. Without this parameter the program will not be able to access a remote BCM via modem. |
| -n<phoneNumber> | To specify the phone number to be used on all remote accesses. The user is never prompted for a phone number if the option is present. |
| -d | Indicates that the program should attempt an unattended download of the event records to be stored in file EVENTS.DAT. |
| -s | Same as -d only the summary report is retrieved and placed in file SUMMARY.DOC. This option can be used in combination with the -d option for retrieving both data sets during the same session. |
| -fMM/DD/YY | When the event records are retrieved, records with a date before this date are filtered out. The date is specified by the month, the day and the year as shown. |
| -2 | As a default, the program will use COM1 for communication. If this command parameter is specified, COM2 will be used. |
| -e | When errors occur, a dialog window explains the error and requires a user response. During unattended operation, this is not desirable. This command line option causes BCM.EXE to return to DOS on an error condition rather than wait for a response. BCM.EXE will return an exit code of '1'. |

If the battery cycle monitor program encounters problems or errors, it notifies the user by presenting an error dialogue box. The error message explains the reason for the error and also gives additional instructions if required.

If the operator uses the program BCM.EXE to write an event record to a disk, the event records are always placed in EVENT.DAT. If the operator runs a program XLATE.EXE, this will convert the data stored in EVENT.DAT to comma delimited ASCII text with a new line to signify end of record. The ASCII text file is stored in a file EVENTS.DIF. This type of file can be loaded and manipulated by most commercial spreadsheet and database programs. All records are separated by new lines. The fields within the records are separated by commas.

Although diagnostics, calibration, startup and program parameters are preferably set at the factory, they can be altered by the user by accessing the utility menu. The utility menu can only be accessed after the correct password has been supplied by the user. Two passwords allow access to the utility menu; there are the user and system passwords. The user password is set by the user and can be changed in the diagnostics menu. The battery cycle monitor user password is preferably always the string "information" after manufacture. The system password is a constant and can be used if the user password is lost. Passwords must preferably be at least 9 characters but less than 32 characters. They can include upper and lower case characters, numbers and the symbols ":;<=>?@ \ ^".

When the utility menu is selected, the battery cycle monitor will prompt for a password to be entered as follows:

DS500T OS V1.00 (c) Emtrol, Inc.
Password?

After the prompt, the user must wait about two seconds before typing the password. As the password is typed, a '.' is displayed on the screen for each character entered. The system allows up to 15 seconds for the password to be entered. Once in the utility menu, the user can chose from four submenus. These menus and their options are shown in FIG. 27.

To select a menu option, the user types the letter that is enclosed in parenthesis for that option. The battery cycle monitor prompts for a selection from the diagnostics menu with the message "enter a command. [O,W,T,V,S,Q]?". The letters enclosed in square brackets are the possible option characters for the user to type. For instance, to select (T)ime and date from the utility menu, the user types a 'T'.

There is an additional hidden parameter in the diagnostics menu. This option can be selected by entering a HEX 0×1f followed by a dash, '-'. The battery cycle monitor then prompts for permission to erase all of the event and history data that is stored in nonvolatile memory. If positive acknowledgement is given, all data is erased, otherwise, the user is returned to the diagnostic menu. After the data is erased, the battery cycle monitor records a record with RID to zero.

FIGS. 8 through 18 are flow chart block diagrams indicative of the basic functions of the battery cycle monitor software. The steps of the main program are diagrammed in FIG. 8. Once the battery cycle monitor is reset, the software executes a self-diagnostic program to ascertain the existence of needed hardware and initializes variables necessary to render the battery cycle monitor operational.

Once initialization is complete, the battery cycle monitor software enters a loop. In the main program, the software causes the apparatus to monitor designated parameters to determine whether an event has occurred.

The battery cycle monitor recognizes presence or absence of utility power. If utility power is presently available and was previously available, the battery cycle monitor merely checks the status of the device which interfaces with it, for example modem, and toggles run bit CP.O. An external device attached to pin $A_7$ of microprocessor 10 in FIG. 1 receives this data.

The external device uses this data to determine battery cycle monitor scan time.

After the run bit has been toggled, the battery cycle monitor goes back to the beginning of the main program and checks for an event. If utility power had been previously unavailable, the battery cycle monitor software executes its initialization routine, stores "utility restore event record 4", and checks the status of the battery cycle monitor interfaces. Regardless of the previous availability of utility power, a run bit CP.O is toggled and the main program begins again.

If utility power fails, the battery cycle monitor activates. If utility power failure had just occurred, the battery cycle monitor stores "utility loss event record 3". If the previous check on utility power showed power absence, a record is not stored this time. Regardless of whether the power failure had just occurred, the battery cycle monitor prepares for battery backup idle.

The battery cycle monitor will then idle for a certain period of time between scans. The first scan after power loss is within 2.5 seconds. Within the first thirty (30.0) seconds after power loss, voltage across the battery string and current flowing through the shunt are scanned every five (5) seconds. After thirty (30.0) seconds without power, every other scan is for temperature and backup internal battery power. Operator interfaces will not function until someone restores utility power.

Figure 9:
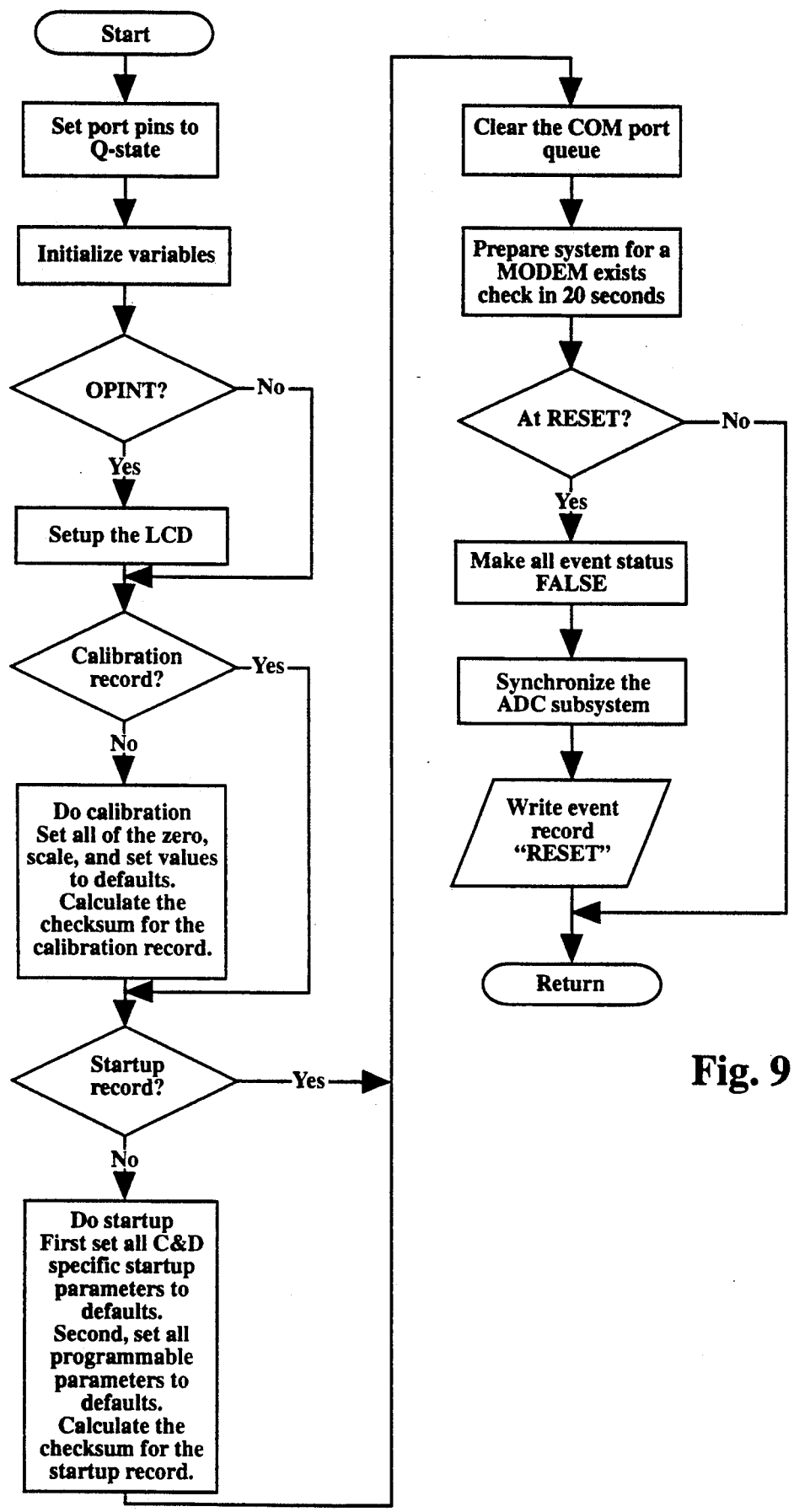
FIGS. 9–18 are flow charts depicting steps followed by the microprocessor in executing certain software instructions and thereby performing respective portions of the method of the invention.

FIG. 9 shows a block diagram of the subroutine responsible for performing initialization as needed in the main program. All port pins are set to Q-state. (Q stands for quiescent.) This puts port pins into their normal operating state. When the reset button is pushed or utility power is lost, some hardware shuts down. Some variables must be reinitialized to make the battery cycle monitor apparatus and method totally operational again.

The battery cycle monitor subroutine initialization program searches for the existence of the operator interface OPINT. The startup and calibration records come into existence the very first time the battery cycle monitor is powered on. Preferably, calibration and startup takes place at the factory.

After the calibration and startup programs have executed, the initialization program continues by clearing the COM port queue. (A queue is a line of items waiting for service, such as messages to be transmitted in a message-switching system.) This ends any previous communications between the battery cycle monitor and a printer or computer through the COM port. This permits a computer or printer to renew its communication with the battery cycle monitor. After the COM port has been cleared, the initialization subroutine prepares the system for a modem exist check in about 20 (twenty) seconds. The program then looks to see whether the reset button has been pushed. If the button has been pushed, all event status are made false and the analog-to-digital convertor subsystem is synchronized. All event status are made false so that no records will be written during reset except for event record "0". The date, time and record event number "0" are stored in memory. The initialization program now reverts back to the main program. If the reset button was not pushed, the last three steps do not take place and the subroutine would immediately return to the main program in FIG. 8.

Figure 10:
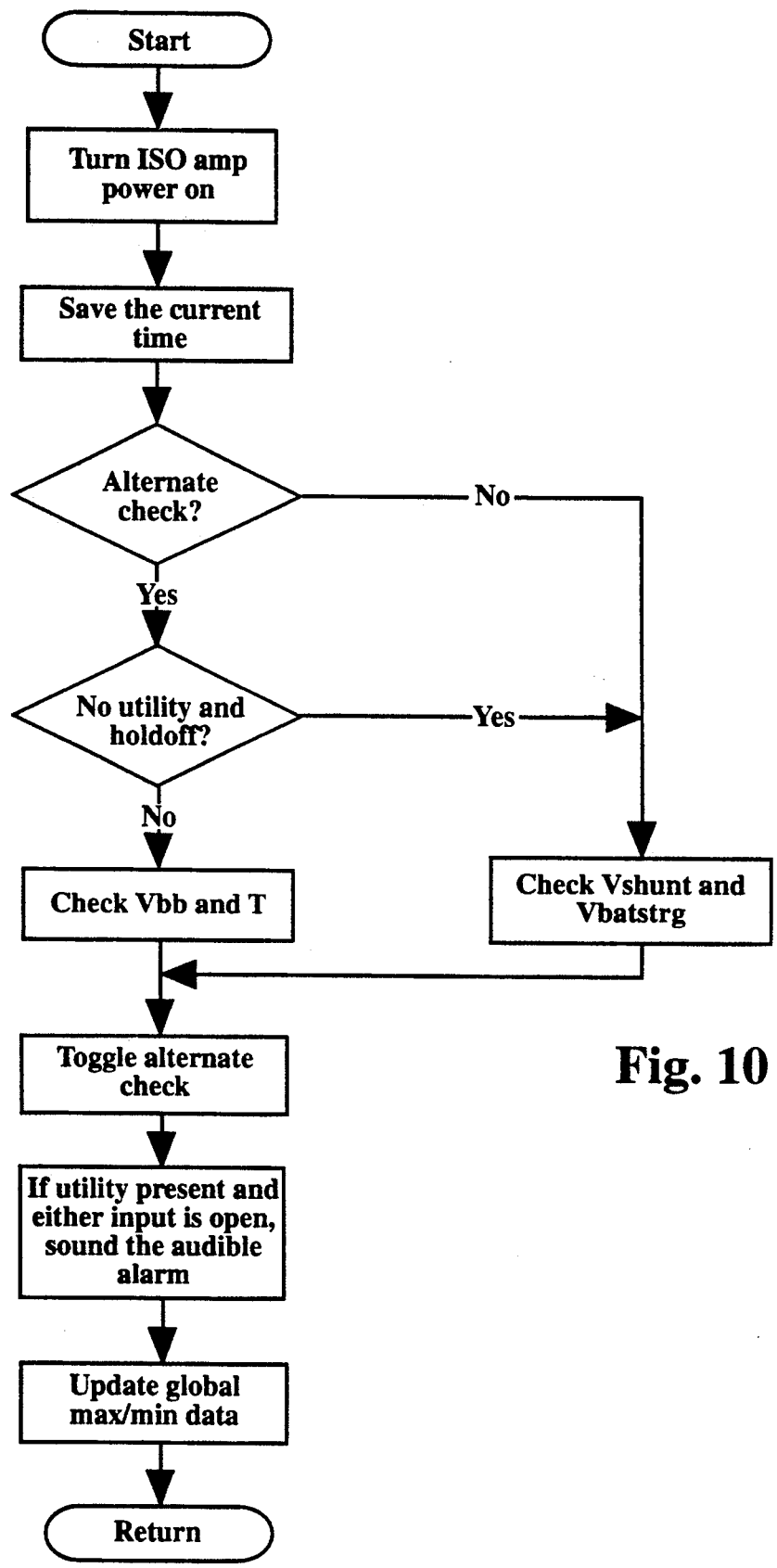

Referencing FIG. 10, the block diagram shows the decision making tree used to determine whether an event has occurred. The software signals the hardware to supply power to the isolation amplifiers to enable collection of input data. This routine stores the current time and date in temporary memory. If the alternate check is "no", the event status routine goes to the subroutine shown in FIG. 12, which checks the shunt voltage and the voltage across the battery string before returning to this event status routine.

If the alternate check is "yes", the battery cycle monitor must ascertain whether utility power is available and whether the battery voltage and temperature were checked the last time the alternate check was "yes". If there is no utility power and input data concerning internal battery voltage and temperature were collected the last time the alternate check was "yes", this event status routine goes to a subroutine in FIG. 12 which checks voltage across the shunt and voltage across the battery string before returning to this event status routine.

Since the resistance of the shunt is known and voltage across the shunt has been measured, the shunt current can be calculated using Ohm's law. If utility power is lost and backup internal battery voltage and temperature were not determined the last time the alternate check was "yes", this routine goes to the subroutine shown in FIG. 11 which collects the backup internal battery voltage and temperature data before returning to the event status routine.

After returning from one of these two subroutines, the alternate check is toggled. If the battery cycle monitor software discovers that utility power is present and either input is open, the battery cycle monitor software sends a signal activity the audible alarm. Finally, the input variables most recently collected ar compared to the historic maximum or minimum input variable. If the magnitudes of the new input variables are greater than the present historic maximum or minimum variables, the historic maximum or minimum variables are updated. The event status routine then returns to the main program.

Figure 11:
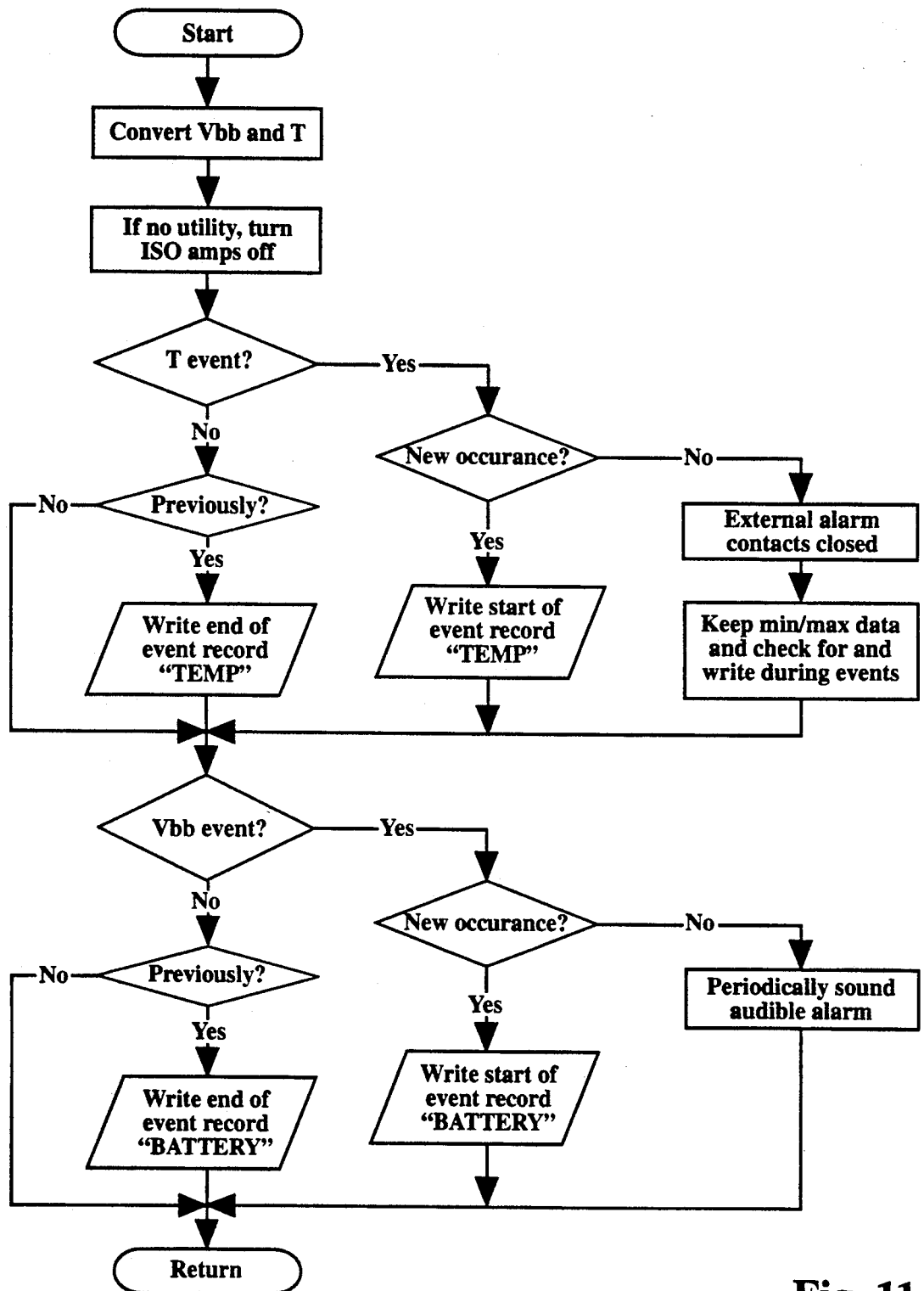

Referencing FIG. 11, this subroutine of the event status routine shown in FIG. 10 determines whether a temperature deviation event or an internal battery voltage deviation event has occurred. Once the event status routine checks backup internal battery voltage and temperature, the battery cycle monitor software commands microprocessor 10 to send a signal to multiplexer 72 to provide the internal battery voltage to analog-to-digital convertor 40. Analog-to-digital convertor 40 converts the internal battery voltage signal to digital format which is output to microprocessor 10. Microprocessor 10 also signals multiplexer 72 to voltage representing external temperature to analog-to-digital convertor 40. Analog-to-digital convertor 40 working with microprocessor 10 again transforms the voltage representing the temperature to digital format and outputs the digital representation of temperature to microprocessor 10. Both digital representations are stored in temporary memory in microprocessor 10.

If there is no public utility power the isolation amplifiers are turned off. The battery cycle monitor software determines whether a temperature event has occurred by comparing the present temperature with the predetermined nominal temperature plus or minus a predetermined temperature deviation. If a temperature event had not been detected during the previous examination of external temperature and is not detected now, the analysis continues by determining whether a backup internal battery voltage event has occurred.

If a temperature event has not occurred but a temperature event had occurred during the last examination, end of event record "18" is stored in memory. On the other hand, if the comparison indicates that the temperature deviation event has occurred and it is a new occurrence, the software will write a start of event record "16" in memory.

If a temperature deviation event is occurring but it is not a new occurrence, the external alarm contacts are closed. The minimum or maximum temperature deviation for this temperature deviation event is updated. If change in temperature from the last measured temperature to the present measured temperature is greater than predetermined nominal temperature deviation, this change in temperature is a temperature deviation event "17" and is therefore recorded in memory.

Regardless of whether a temperature deviation event has occurred, the battery cycle monitor checks to determine if an backup internal battery voltage deviation event has occurred. If the reading indicates that a backup internal battery voltage deviation event was not occurring and a backup internal battery voltage deviation had not occurred the last time this subroutine was accessed, then this subroutine returns to the event status routine. If the present backup internal battery voltage indicates that there is no internal battery voltage deviation but there had been internal battery voltage deviation the last time this subroutine was accessed, the battery cycle monitor software writes end of event record "3" into memory. This routine then returns to the event status routine in FIG. 11. However, if a new internal battery voltage deviating event is occurring, the battery cycle monitor software stores a start event record "2" in memory before returning to the event status program. If a voltage deviation event has occurred and had occurred during the last time the routine was accessed, the audible alarm is sounded before the subroutine returns to event status routine.

Figure 12:
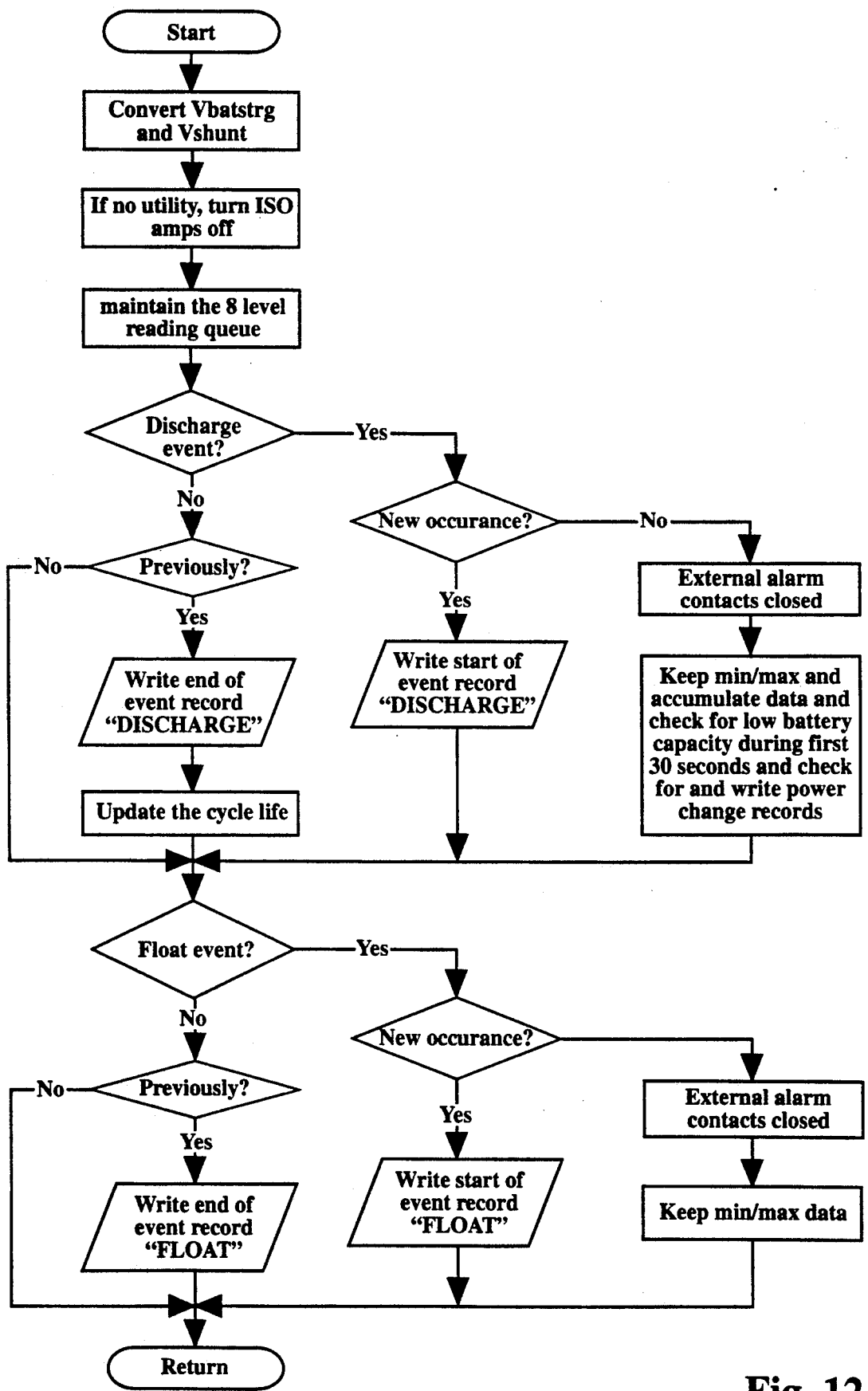

If the event status routine in FIG. 10 checks voltage across the shunt and voltage across the battery string, it will access the subroutine in FIG. 12. The battery cycle monitor software commands microprocessor 10 to send signal to multiplexer 72 causing it to output the battery string voltage to the analog-to-digital convertor 40. Analog-to-digital convertor 40 works with microprocessor 10 to convert the voltage across the battery string to a digital format. In a similar fashion, the battery cycle monitor converts the shunt voltage from an analog signal to a digital signal. Both the converted battery string voltage and shunt voltage are stored in temporary memory in microprocessor 10. If there is no utility power, the isolation amplifiers 78, 88 are turned off.

Regardless the status of utility power, the eight level reading queue is maintained so that the most recent input variables collected by the battery cycle monitor remain in temporary memory. Battery cycle monitor must determine whether a discharge event has just occurred using the tests in Table 1. If the discharge event had not occurred and has not occurred during the last time this subroutine was accessed, the analysis continues by determining whether a uninterruptible power supply system voltage deviation event has occurred. An uninterruptible power supply system voltage deviation event is called "float" event in FIG. 12. If a discharge event has ceased to occur, the battery cycle monitor software will store the end of event record battery discharge with "14".

The cycle life of the uninterruptible power supply system battery is now updated and the analysis continues to determine whether a uninterruptible power supply system voltage deviation event has occurred. Cycle life indicates the percentage of life remaining in the uninterruptible power supply system. If a discharge event has occurred and it is a new occurrence, the start of event record "12" is recorded in memory and analysis continues to determine whether an uninterruptible power supply system voltage deviation event has occurred. If a discharge event is in progress but it was in progress the last time this subroutine was accessed, the external alarm contacts close. The most recent current discharge is compared with the minimum or maximum discharge since the battery discharge first began, thus updating the maximum or minimum since battery discharge deviation began. The battery cycle monitor software also checks for low battery capacity during the first thirty (30) seconds of the discharge event and checks for and writes power change event records with "3" in memory.

The analysis continues by determining whether a float event deviation has occurred.

If the float deviation is not presently occurring and had not previously occurred during the last time this subroutine was accessed, this subroutine is over and returns to the event status routine. If the uninterruptible power supply system battery voltage deviation is not occurring but had occurred during the last time this subroutine was accessed, the end of event record with "11" is written into memory before returning to the event status routine. If a float event is occurring and it is a new occurrence, the battery cycle monitor software writes start of event record "10" to memory before returning to event status routine. If a float deviation event is occurring and had occurred during the previous iteration, the external alarm contacts are closed and this new reading is compared to the maximum or minimum uninterruptible power supply system battery voltage since the uninterruptible power supply system battery voltage deviation event began. After this comparison, this routine ends and returns to the event status routine.

Figure 13:
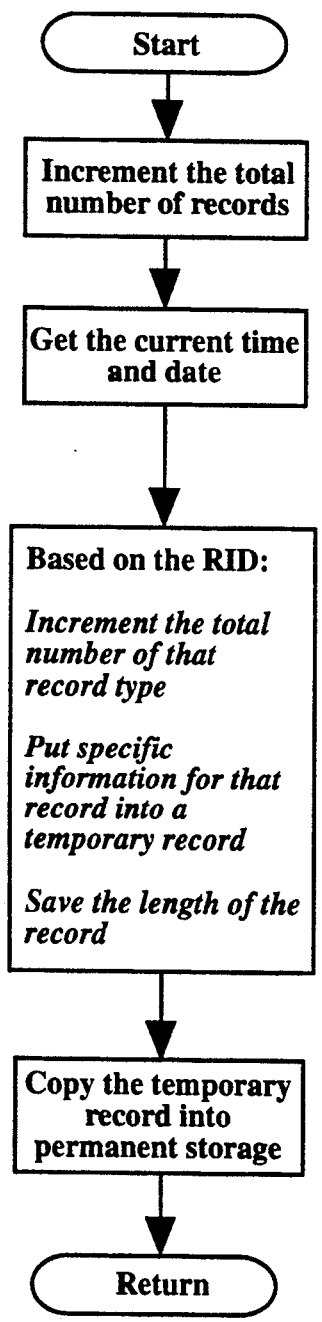

The subroutine shown on FIG. 13 is largely utilized by routines in FIGS. 8 through 18 for storing event records. The subroutine starts by incrementing the total number of records and bringing into temporary memory the current time and date. Based on the record identification number, the total number of that type of record is incremented by one. The specific information for that type of record is placed into a temporary record. The length of the record is saved and a copy of the temporary record is placed in permanent storage. After this routine is completed it returns from whichever routine it came.

Figure 8:
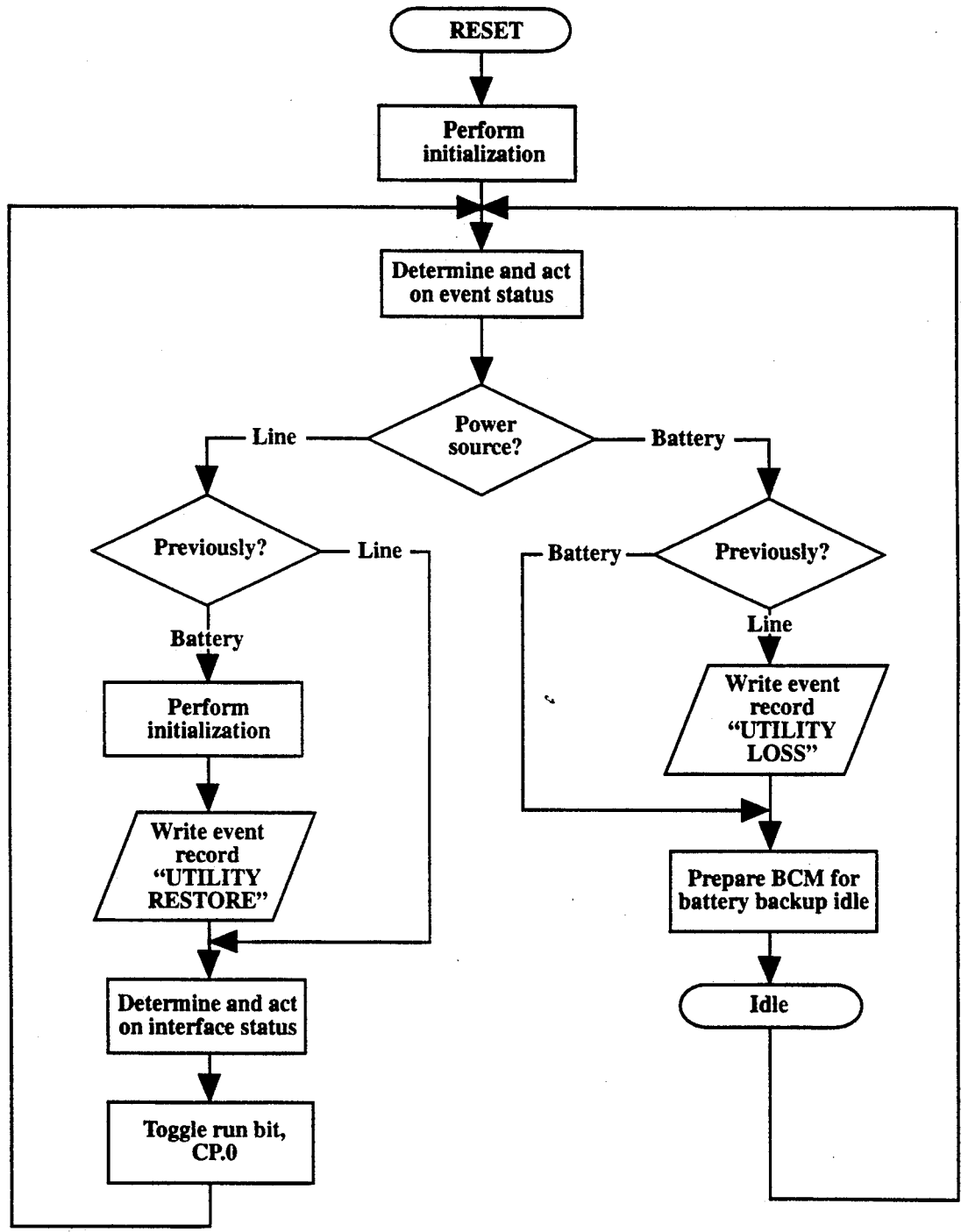
FIG. 8 is a high level flow chart showing an overview of the steps followed by the microprocessor in executing certain software instructions thereby to practice the method of the invention.
Figure 14:
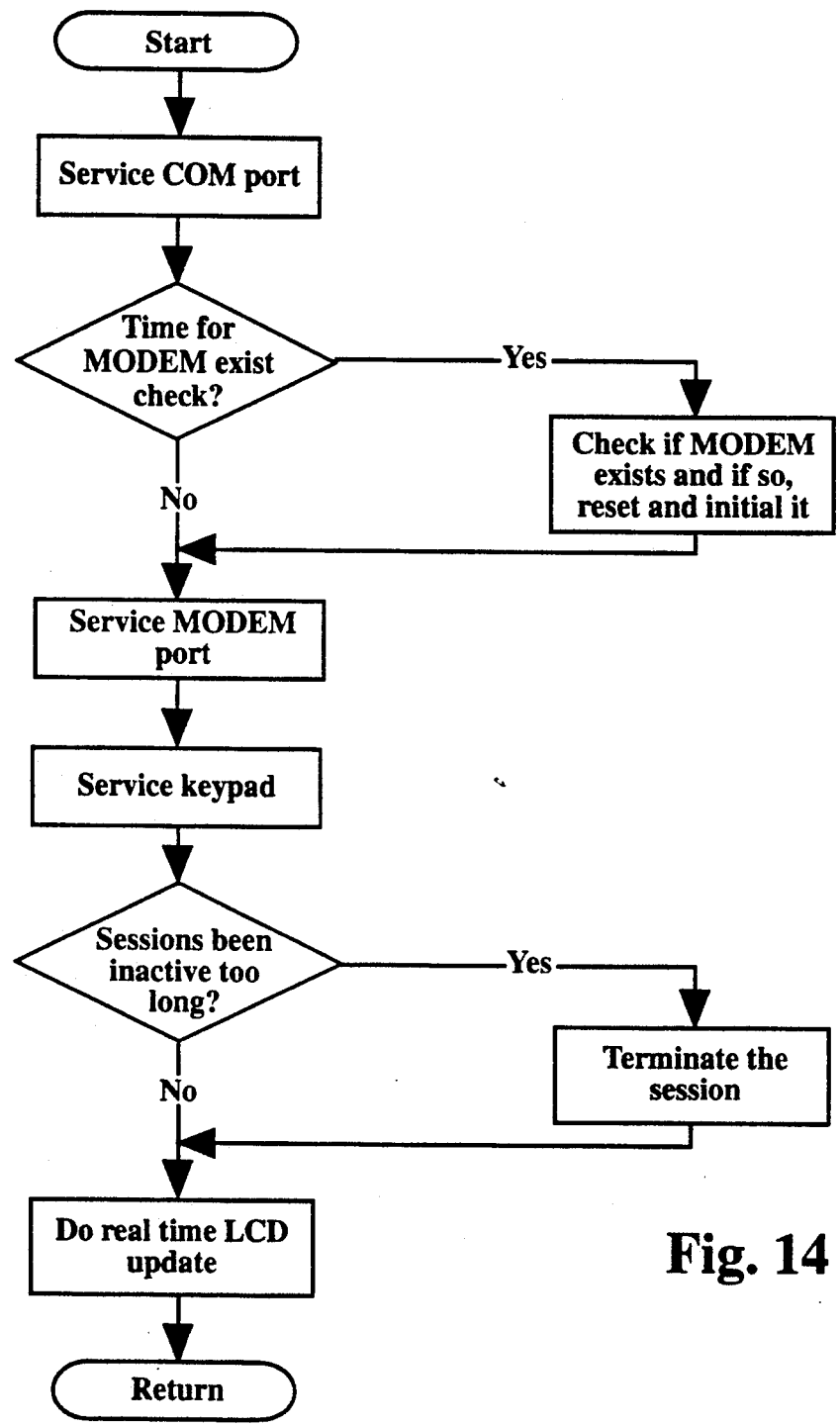

Referencing FIGS. 8 and 14, the main program goes to a routine in FIG. 14, to determine whether a user is attempting to communicate with the battery cycle monitor, as long as utility power is available. First, this routine checks the serial communication port. Second, the routine determines whether or not it is time for a modem exist check. If utility power has just been restored, the initialization routine in FIG. 9 prepares the system for a modem check and the FIG. 14 routine searches for a modem. If a modem exists, the routine will reset and will initialize the modem. If utility power was available during the previous execution of the main program, then the routine of FIG. 14 will not search for a modem. Regardless of whether utility power was previously available or just became available, the interface status routine in FIG. 14 services the modem port and key pad. If the modem, key pad or communication port session has been inactive too long, the session is terminated and the battery cycle monitor turns its attention to monitoring the uninterruptible power supply. If the session has not been inactive too long, the battery cycle monitor permits the user to continue the session. After the operator has completed the session or the battery cycle monitor has terminated the session, the real time LCD display is updated and the interface status routine of FIG. 14 returns to the main program of FIG. 8.

FIGS. 15 through 18 are subroutines called on by the interface status routine of FIG. 14.

Figure 15:
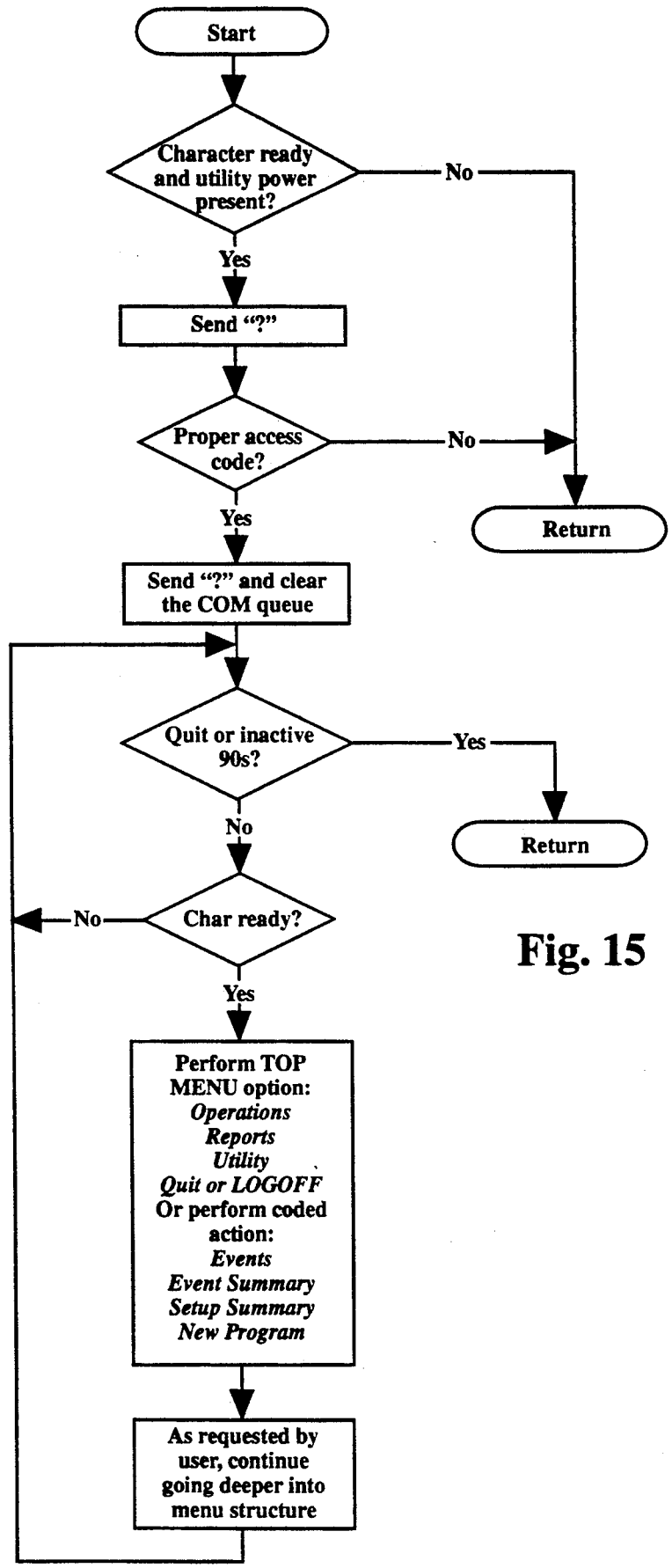

Referencing FIGS. 14 and 15, the interface status routine of FIG. 14 calls on the COM port service subroutine of FIG. 15 to determine whether an operator is accessing the battery cycle monitor. If an operator accesses the battery cycle monitor through the COM port, this subroutine carries out the session. While the session is in progress, the battery cycle monitor cannot leave the routine to go back to the main program of FIG. 8 and monitor the uninterruptible power supply system until the operator logs off or the session becomes inactive.

If utility power is present and the operator is sending a character such as a <RET> to the COM port, the battery cycle monitor responds by sending a prompt. The battery cycle monitor prompt is "?". If the operator enters the proper access code, the battery cycle monitor clears the COM queue and sends a prompt "?". If utility power was unavailable, the proper access code was not given, or an operator was not sending any characters to the COM port, the subroutine terminates and returns to the interface status routine in FIG. 14. If the operator quits or does not enter characters for a period of time, the session terminates and the subroutine returns the interface status routine.

Once the operator enters the proper password, the battery cycle monitor sends a prompt and provides menus so that an interactive session can begin. The operator can access information using the different menus and download files from the battery cycle monitor into his or her computer. Once the operator quits or the session has become inactive, the subroutine returns to the interface status routine.

Figure 16:
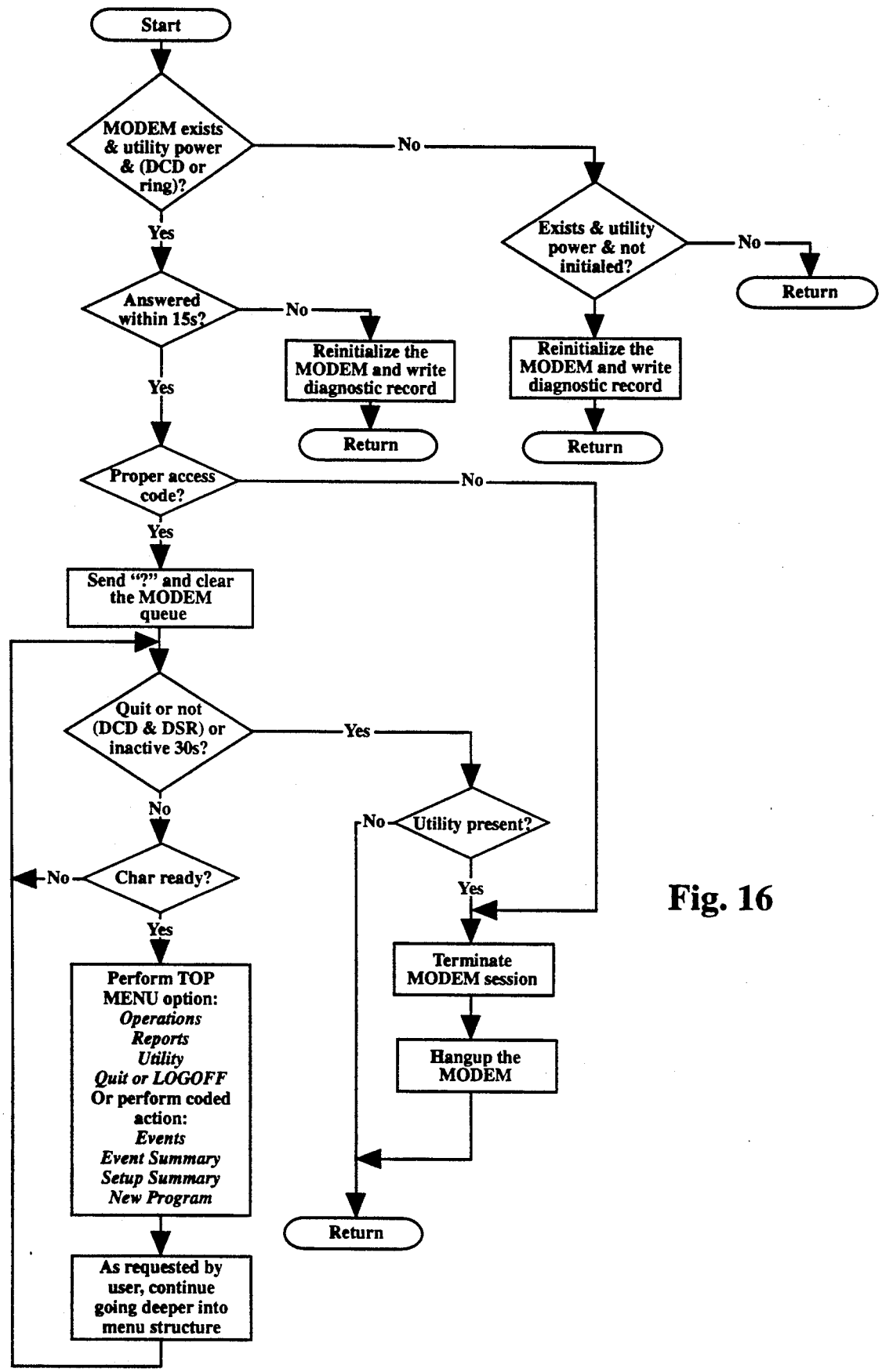

Referring to FIGS. 14 and 16, the interface status routine of FIG. 14 calls upon the modem service subroutine of FIG. 16 to determine whether an operator is accessing the battery cycle monitor. If an operator accesses the battery cycle monitor through a modem, this subroutine carries out the session. Once a session has started, the battery cycle monitor cannot leave the subroutine to go back to the main program in FIG. 8 and monitor the uninterruptible power supply system until the operator logs off or the session is inactive for too long.

If a modem does not exist or utility power does not exist, the routine returns to the interface status routine of FIG. 14. If a modem exists and utility power exists but the modem has not been initialized, the modem is reinitialized and a diagnostic record is written. If a modem exists and utility power is available and a DCD or ring has been detected, the battery cycle monitor should answer in about 15 seconds. ("DCD" stands for data carrier detect.) A DCD is necessary for the modem to communicate with the battery cycle monitor. If the battery cycle monitor does not answer the remote computer within 15 seconds, the modem is reinitialized, a diagnostic record is written and the modem service subroutine returns to the interface subroutine. If the battery cycle monitor answers the remote computer within 15 seconds, the battery cycle monitor looks for the proper access code. If the battery cycle monitor does not receive the proper access code, the modem session terminates, battery cycle monitor modem hangs up and the modem service routine returns to the interface status routine.

If the battery cycle monitor receives the proper access code, the battery cycle monitor sends a prompt "?" and clears the modem queue.

If the session has been inactive for 30 seconds or if the operator has quit or if the data carrier detect is not in its true state or if data set ready is not in its true state, then the battery cycle monitor must determine if utility is present. If utility is not present, the battery cycle monitor returns from the service modem subroutine to the interface status routine. If utility power is present, the session is terminated and the battery cycle monitor hangs up the modem before it returns to the interface status routine.

If the operator has not quit, if the DCD and DSR are in their true states and if the session has not been inactive for 30 seconds, the battery cycle monitor looks for a character at its modem port. (DSR stands for "data set ready".) Every modem has a data set ready line. This line indicates that the battery cycle monitor modem is ready to receive characters. If the battery cycle monitor does not detect a character, it keeps checking for a character. Once a character appears at the modem port, the battery cycle monitor reads the character and performs the command. The operator can command the battery cycle monitor to access menus and download files from the battery cycle monitor into his or her computer.

Figure 17:
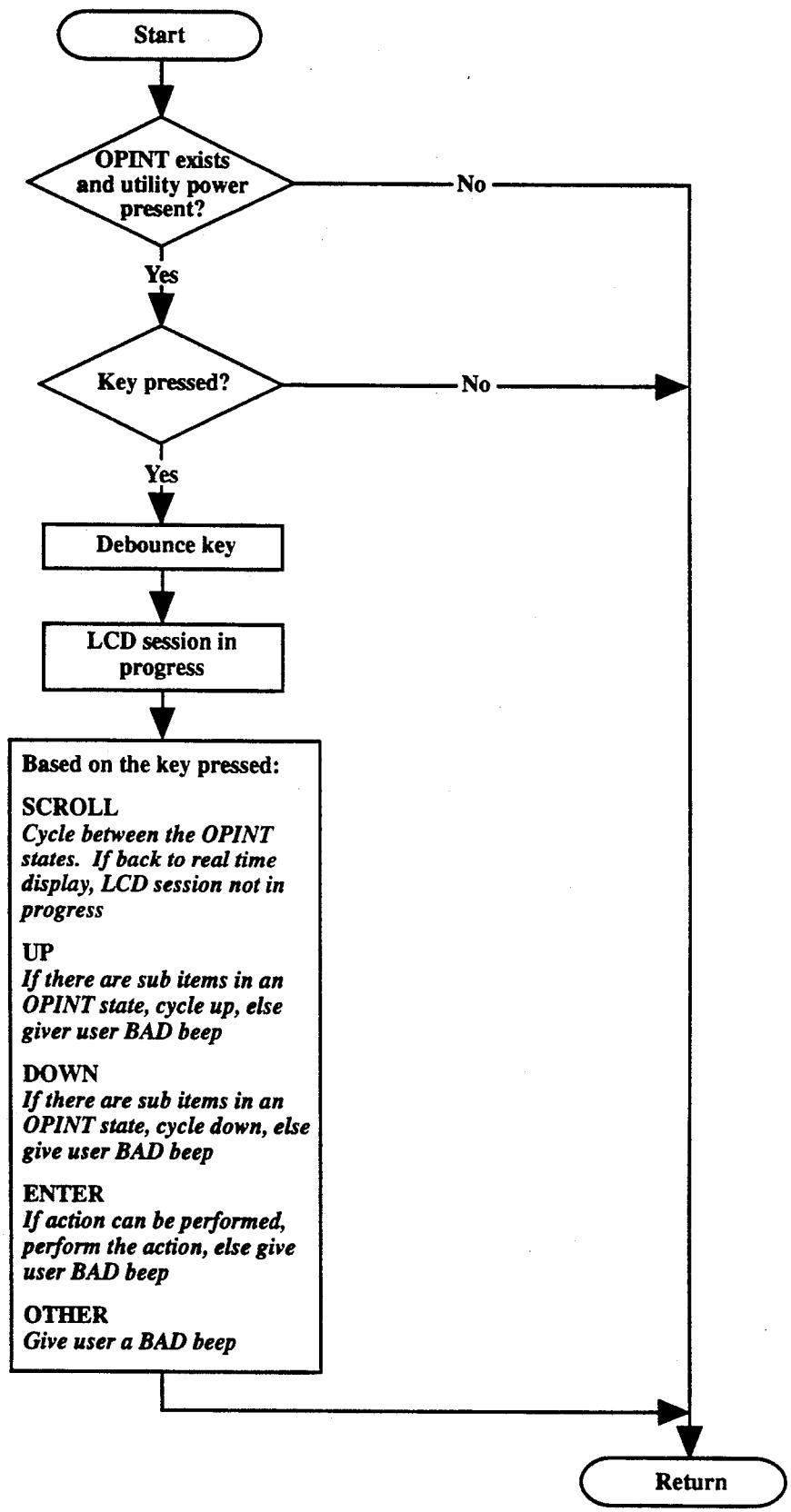

Referencing FIG. 17, this subroutine services the key pad. If the operator interface OPINT does not exist or if utility power is unavailable, then this subroutine terminates and returns to the interface status routine in FIG. 14. If OPINT exists and utility power is available, the routine checks to see if the key has been pressed. If no key has been pressed, the routine terminates and returns to the interface routine in FIG. 14. If the key has been pressed, the LCD session is in progress. The user or operator has the attention of the battery cycle monitor software. The battery cycle monitor can perform any of the tasks listed in Table 4 below:

TABLE 4

| Menu | Information |
| --- | --- |
| MEMORY STATUS: | Displays the status of the BCM's memory usage. |
| SUMMARY VIEW: | By using the 2 and 1 keys, the event summary report can be viewed. The < and > symbols are used to represent minimum and maximum values respectively. |
| INTERNAL BATTERY: | Displays the voltage of the internal backup batteries. |
| PRINT EVENT SUMMARY: | Allow the event summary to be sent to the CCM port. To print the report, press the ENTER key. |
| PRINT SETUP SUMMARY: | Allow the setup summary to be sent to the CCM port. To print the report, press the ENTER key. |

TABLE 4-continued

| Menu | Information |
| --- | --- |
| BCM CONFIGURATION | Displays the configuration of the BCM including the software revision. |
| Real time display of input variables | Normally, the LCD display will show the date and time, battery string voltage, battery current and ambient temperature. During an event, the type of event is indicated at the bottom of the LCD display. |

After the user quits the session or the session has been inactive for too long, the service key pad subroutine terminates and returns to the interface status routine.

Figure 18:
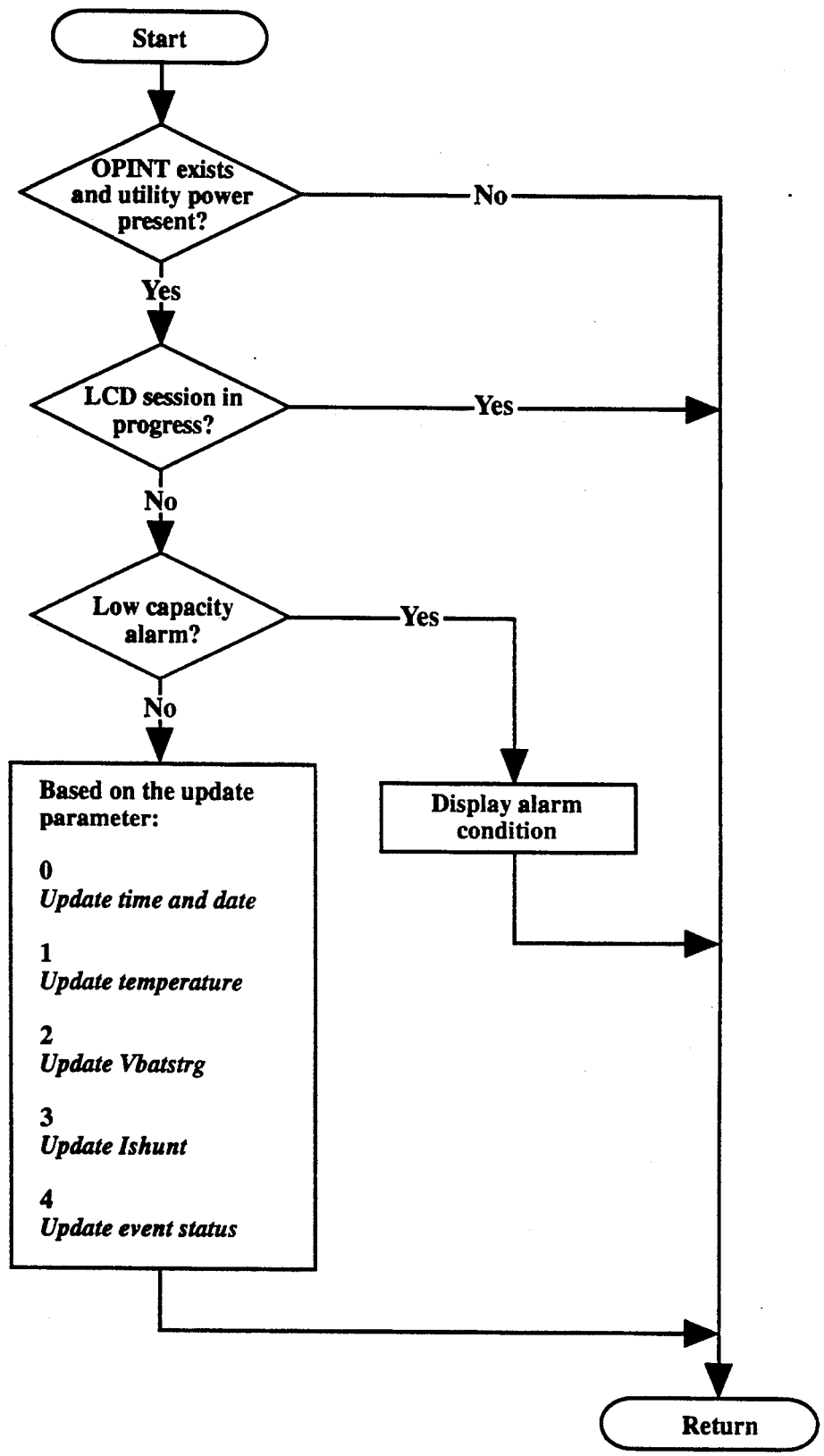

Referencing FIG. 18, the interface status routine accesses the real time LCD update routine to update the LCD display to indicate the values of the input variables. If OPINT does not exist or utility power is unavailable, this routine terminates and returns to the interface status routine of FIG. 14. If OPINT exists, utility power is present and a LCD session is in progress, this routine will terminate and return to the interface status routine. If OPINT exists, utility power is available, LCD session is not in progress and there is no low capacity alarm, the time and date, temperature, battery string voltage, shunt current and event status is updated. After updating has occurred, the routine terminates and returns to the interface status routine of FIG. 14. If OPINT exists, utility power is present, LCD session is in progress, and a low capacity alarm is activated, an alarm condition is displayed and this routine terminates and returns to the interface status routine.

While the preferred embodiments of the invention have been described above, the scope of protection to which the invention is believed entitled is defined by the claims, and by equivalents thereto which perform substantially the same function in substantially the same way to achieve substantially the same result as set forth in the claims, so long as such substantial equivalents, as defined by a claim for such substantial equivalent, do not read on the prior art.

What is claimed is:

1. Apparatus for monitoring operation and recording status of at least one battery component of an uninterruptible power supply system, comprising:
   a. means for sensing physical parameters associated with said battery defining battery status;
   b. means for visibly displaying alphanumeric characters indicative of present values of said physical parameters defining status of said uninterruptible power supply system battery;
   c. means for electronically storing said sensed parameters upon deviation from preselected limits, to provide a historical chronology of said uninterruptible power supply system battery operation;
   d. means for supplying backup power to said apparatus upon interruption of utility power to said apparatus;
   e. means for triggering an alarm for signaling an operator upon interruption of said utility power;
   f. means for triggering said alarm upon one of said parameters deviating from associated predetermined limits.

2. Apparatus of claim 1 wherein said physical parameters include battery voltage, ambient battery temperature and battery discharge current.

3. Apparatus of claim 2 wherein said stored parameters include battery voltage, battery ambient temperature, battery discharge current, date and time.

4. Apparatus of claim 1 further comprising means for visibly displaying alphanumeric characters indicative of said stored parameters.

5. Apparatus of claim 4 further comprising means, operative responsively to tactiley applied force, for changing said battery operating parameter for which said display means provides said indicative alphanumeric characters.

6. Apparatus of claim 5 further comprising modem means enabling remote access, by an independent computing device having its own modem, to said stored parameters.

7. Apparatus of claim 6 further comprising means, adapted to be connected to a communications port, for providing said stored parameters in computer readable form from said storage means to said port for access by a computing and/or printing device.

8. A method for monitoring operation and status of an uninterruptible power system, comprising:
   a. monitoring said battery voltage;
   b. comparing said monitored battery voltage to a predetermined specified float voltage range;
   c. electronically storing value of said voltage, of current discharge, of date and of time in memory of a computing device upon battery voltage deviation from a predetermined specified float voltage;
   d. electronically storing values of voltage, discharge current, date and time in memory of computing device upon return of voltage from deviation into said predetermined float range;
   e. determining whether said voltage during said deviation was less than or greater than the predetermined float voltage range;
   f. classifying largest voltage deviation during said event as a maximum or a minimum voltage depending on whether said voltage was higher or lower than predetermined float voltage range during said event; and
   g. comparing said maximum or minimum voltage of said event to a previously stored highest or lowest voltage of said battery, and electronically storing in memory of said computing device the higher or lower voltage as the maximum or minimum voltage depending on whether said voltage was higher or lower than predetermined float voltage range during said event.

9. Apparatus of claim 1 comprising means for transmitting said historical chronology to a displaying device to allow viewing of said historical chronology.

10. Apparatus of claim 9 wherein the displaying device is a printer.

11. Apparatus of claim 9 wherein the displaying device is a terminal.

12. Apparatus of claim 9 wherein the means for transmitting is a modem.

13. A method for monitoring discharge of current from an uninterruptible power system, comprising:
   a. monitoring an uninterruptible power system battery to detect current discharge events;
   b. electronically storing values of said current, voltage, date and time upon detection of current discharge event;
   c. continuously electronically storing values of said current, voltage, date and time during each discharge current event in memory of a computing device to record a historical chronology of operation of said uninterruptible power system battery during said current discharge events;

d. electronically storing values of voltage, date, time, total amps and total kilowatt hours for each current discharge event in memory of a computing device, upon termination of said current discharge event;

e. determining the maximum or minimum current during said discharge current event;

f. classifying largest current discharge as a maximum or a minimum depending on direction of said current;

g. comparing said maximum or minimum voltage of said event to a previously highest current discharged as electronically stored in memory of said computing device, and electronically storing the higher or lower current discharge depending on the direction of said current; and h. determining duration of said event, categorizing said event based on said duration, and electronically storing in memory of computing device the result of said categorization.

14. The method of claim 13 further comprising:

a. detecting availability of utility power;

b. upon detection of unavailability of utility power, electronically storing in memory of a computing device date and time that utility power became unavailable; and c. upon restoration of utility power, electronically storing in memory of said computing device date and time that utility power was restored.

15. The method of claim 14 wherein said monitoring further comprises continuously monitoring voltage of said uninterruptible power system battery and sending a signal to an alarm contact when said voltage deviates from predetermined specified float voltage range.

16. The method of claim 15 wherein said monitoring further comprises continuously monitoring ambient temperature and sending a signal to an alarm contact upon ambient temperature deviation from predetermined specified temperature range.

17. The method of claim 16 wherein said monitoring further comprises continuously detecting current discharge and sending signal to an alarm contact upon detection of current discharge from said battery.

18. The method of claim 17 wherein said signal is sent to said alarm contact upon sensing unavailability of utility power.

19. The method of claim 18 wherein said monitoring further comprises continuously monitoring uninterruptible power system battery operating parameters as long as utility power is available but only periodically monitoring the uninterruptible power system battery operating parameters when utility power is unavailable.

20. Apparatus for monitoring operation and recording status of at least one battery component of an uninterruptible power supply system, comprising:

a. means for sensing physical parameters associated with said battery, defining battery status;

b. means for visibly displaying alphanumeric characters indicative of present values of said physical parameters defining status of said uninterruptible power supply system battery;

c. means for electronically storing said sense parameters upon their deviation from preselected limits, to provide a historical chronology of said uninterruptible power supply system battery operation;

d. means for supplying backup power to said apparatus upon interruption of utility power to said apparatus;

e. means for triggering said alarm for signaling an operator upon interruption of said utility power;

f. means for triggering said alarm upon one of said parameters deviating from its associated predetermined limits;

g. wherein said physical parameters include battery voltage, ambient battery temperature and battery discharge current.

21. A method for monitoring discharge of current from an uninterruptible power system, comprising:

a. monitoring an uninterruptible power system battery to detect current discharge events;

b. electronically storing values of current, voltage, date and time upon detection of a current discharge event;

c. continuously electronically storing values of said current, voltage, date and time during said discharge current event in memory of a computing device to record a historical chronology of operation of the monitored uninterruptible power system battery during said current discharge events;

d. electronically storing values of voltage, date, time, total amps and total kilowatt hours for a current discharge event in memory of a computing device, upon termination of said current discharge event;

e. determining the largest current flow during said discharge current event;

f. classifying said largest current flow as a maximum or a minimum depending on direction of said current;

g. comparing said maximum or minimum voltage of said event to previous highest current discharged as electronically stored in memory of said computing device, and electronically storing the largest current flow depending on direction of said current; and h. determining duration of said event, categorizing said event based on said duration, and electronically storing in memory of a computing device the results of said categorization;

i. monitoring availability of utility power;

j. upon detection of unavailability of utility power, electronically storing in memory of computing device the date and time utility power became unavailable; and k. upon restoration of utility power, electronically storing in memory of computing device the date and time utility power was restored;

l. continuously monitoring total voltage of the uninterruptible power system battery and sending a signal to an alarm contact when the voltage deviates from the predetermined specified float voltage range;

m. continuously monitoring the ambient temperature and sending a signal to an alarm contact upon ambient temperature deviation from predetermined specified temperature range;

n. continuously detecting discharge current and sending signal to an alarm contact upon detection of a current discharge from said uninterrupted power system battery.

22. Apparatus for monitoring operation and recording status of at least one battery component of a power supply system, comprising:

a. means for sensing physical parameters associated with said battery defining battery status;
b. means for storing said sensed parameters upon deviation from preselected limits, to provide a historical chronology of said supply system battery operation; and
c. means for triggering an alarm upon one of said parameters deviating from associated predetermined limits.

23. Apparatus of claim 22 comprising means for supplying backup power to said apparatus upon interruption of utility power.

24. Apparatus of claim 23 comprising means for triggering said alarm for signaling an operator upon interruption of said utility power.

25. Apparatus of claim 24 comprising means for transmitting said historical chronology to a displaying device to allow viewing of said historical chronology.

26. Apparatus of claim 25 wherein the displaying device is a printer.

27. Apparatus of claim 25 wherein the displaying device is a terminal.

28. Apparatus of claim 27 wherein the means for transmitting is a modem.

* * * * *